(12) United States Patent
Jung et al.

(10) Patent No.: US 11,626,420 B2
(45) Date of Patent: Apr. 11, 2023

(54) SEMICONDUCTOR DEVICE

(71) Applicant: SAMSUNG ELECTRONICS CO., LTD., Suwon-si (KR)

(72) Inventors: Young-Jin Jung, Hwaseong-si (KR); So-Ra Kim, Hwaseong-si (KR); Bong-Tae Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 226 days.

(21) Appl. No.: 17/178,495

(22) Filed: Feb. 18, 2021

(65) Prior Publication Data

US 2021/0202520 A1 Jul. 1, 2021

Related U.S. Application Data

(63) Continuation of application No. 16/520,979, filed on Jul. 24, 2019, now Pat. No. 10,957,708.

(30) Foreign Application Priority Data

Nov. 6, 2018 (KR) .......................... 10-2018-0135332

(51) Int. Cl.
*H01L 29/76* (2006.01)
*H01L 27/11582* (2017.01)
(Continued)

(52) U.S. Cl.
CPC .............. *H01L 27/11582* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/5283* (2013.01); *H01L 23/535* (2013.01);
(Continued)

(58) Field of Classification Search
CPC ......... H01L 27/11582; H01L 21/76805; H01L 21/76816; H01L 21/76877; H01L 21/76895; H01L 23/5226; H01L 23/5283; H01L 23/535; H01L 23/564; H01L 27/11519; H01L 27/11524; H01L 27/11556; H01L 27/1157
See application file for complete search history.

(56) References Cited

U.S. PATENT DOCUMENTS 8,742,466 B2 6/2014 Shim et al.
8,971,118 B2 3/2015 Jin et al.
(Continued)

*Primary Examiner* — Victor A Mandala
*Assistant Examiner* — Colleen E Snow
(74) *Attorney, Agent, or Firm* — F. Chau & Associates, LLC

(57) ABSTRACT

A semiconductor device includes a substrate including a memory cell region and a connection region, a plurality of gate electrodes in the memory cell region and the connection region, a plurality of channel structures passing through the plurality of gate electrodes and extending in a vertical direction in the memory cell region, and a plurality of pad layers extending in a first direction from each of the plurality of gate electrodes in the connection region. The plurality of pad layers is disposed in a stepped form in a second direction. The device further includes a plurality of dummy lines arranged in one row in the first direction between two pad layers adjacent to each other in the second direction and disposed apart from one another with a pad connection region therebetween in the first direction. The pad connection region overlaps two pad layers successively disposed in the first direction.

20 Claims, 25 Drawing Sheets

(51) Int. Cl.
  *H01L 27/11524* (2017.01)
  *H01L 27/11556* (2017.01)
  *H01L 27/11519* (2017.01)
  *H01L 27/1157* (2017.01)
  *H01L 27/11565* (2017.01)
  *H01L 21/768* (2006.01)
  *H01L 23/528* (2006.01)
  *H01L 23/522* (2006.01)
  *H01L 23/00* (2006.01)
  *H01L 23/535* (2006.01)

(52) U.S. Cl.
  CPC ........ *H01L 23/564* (2013.01); *H01L 27/1157* (2013.01); *H01L 27/11519* (2013.01); *H01L 27/11524* (2013.01); *H01L 27/11556* (2013.01); *H01L 27/11565* (2013.01)

(56) References Cited

U.S. PATENT DOCUMENTS

| | | |
|---|---|---|
| 9,640,549 B2 | 5/2017 | Lee et al. |
| 2017/0213845 A1 | 7/2017 | Baba |
| 2017/0309634 A1 | 10/2017 | Noguchi et al. |
| 2018/0026047 A1 | 1/2018 | Park et al. |
| 2018/0083030 A1 | 3/2018 | Yun et al. |
| 2020/0144287 A1 | 5/2020 | Jung et al. |

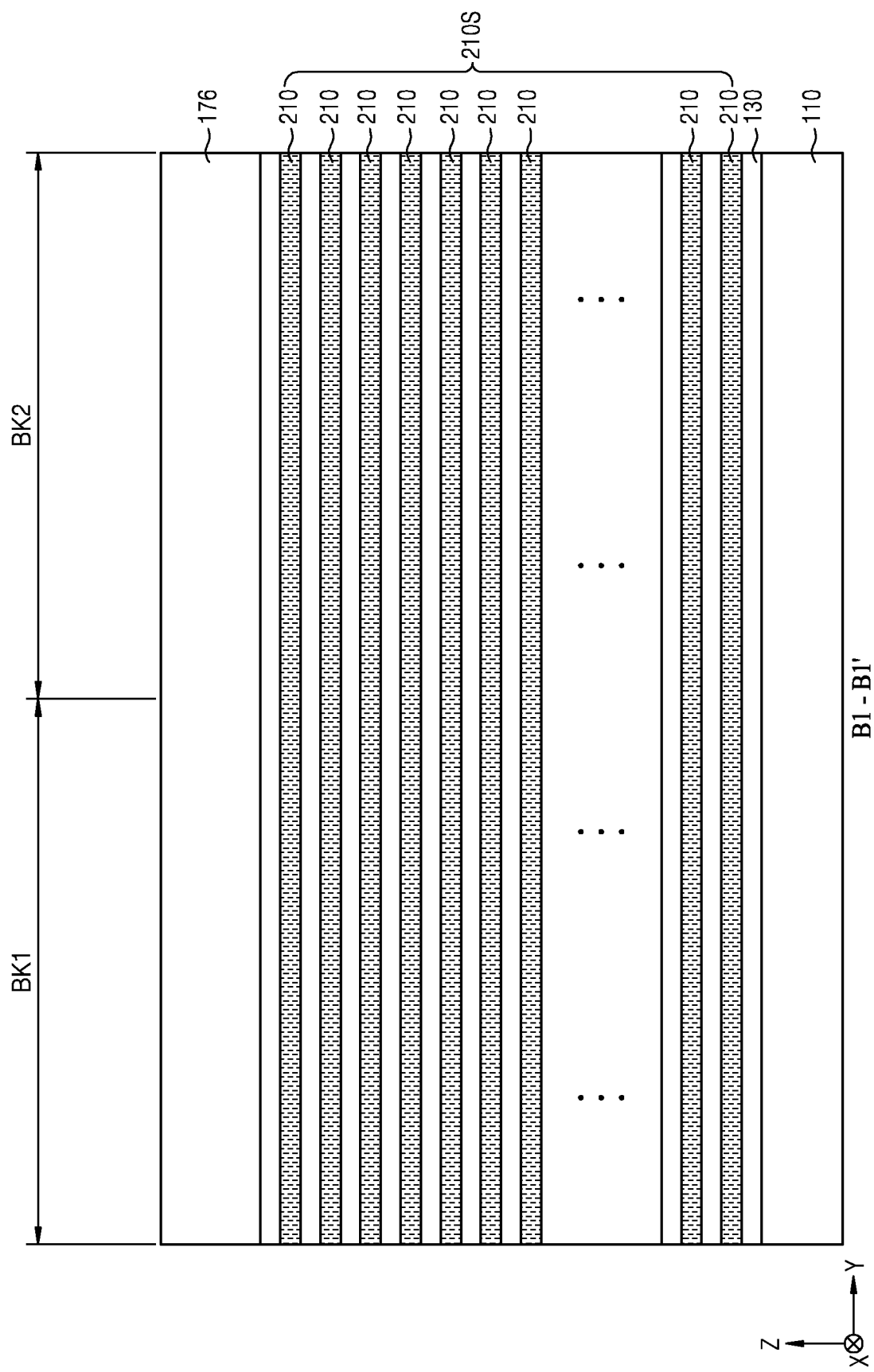

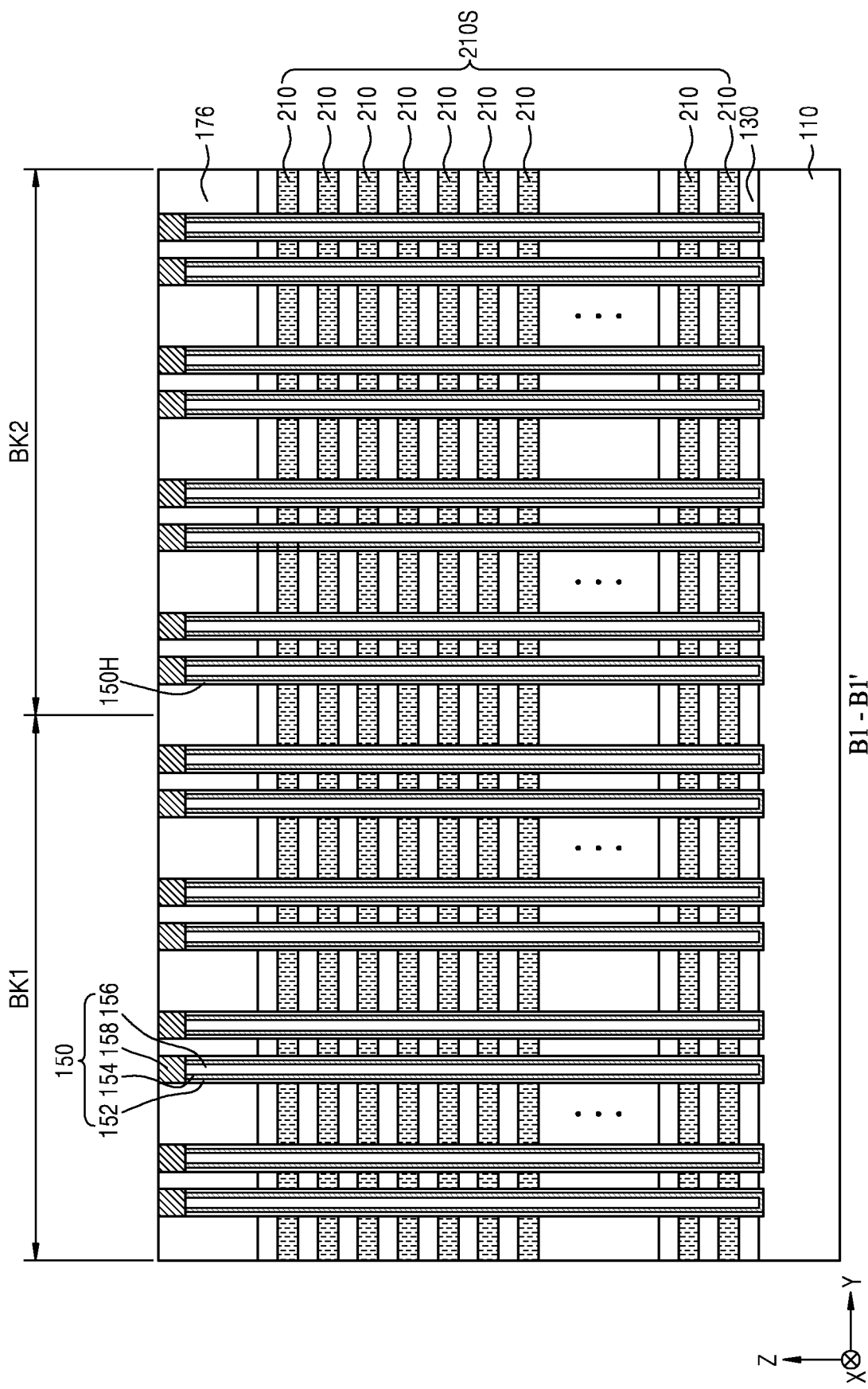

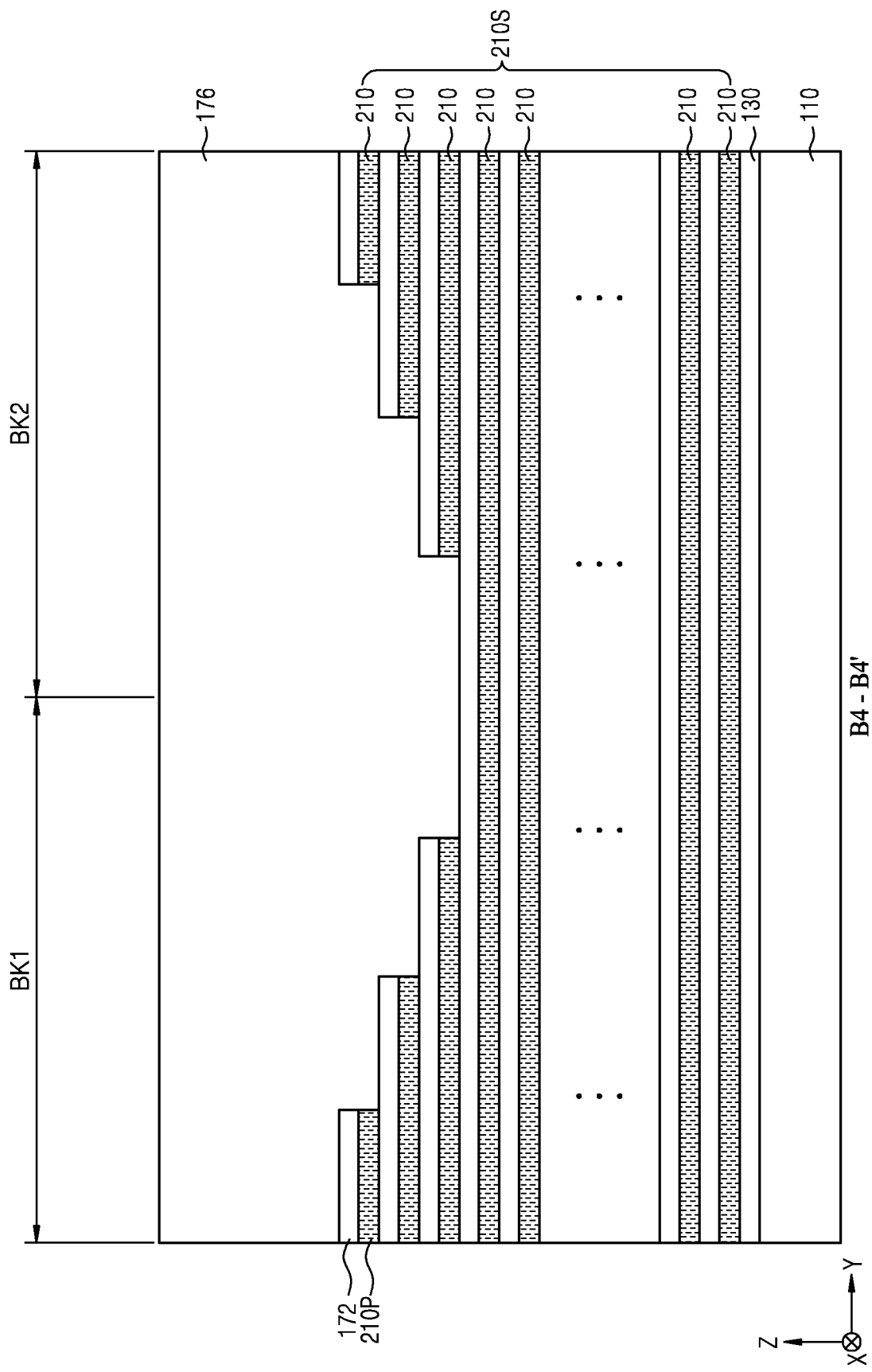

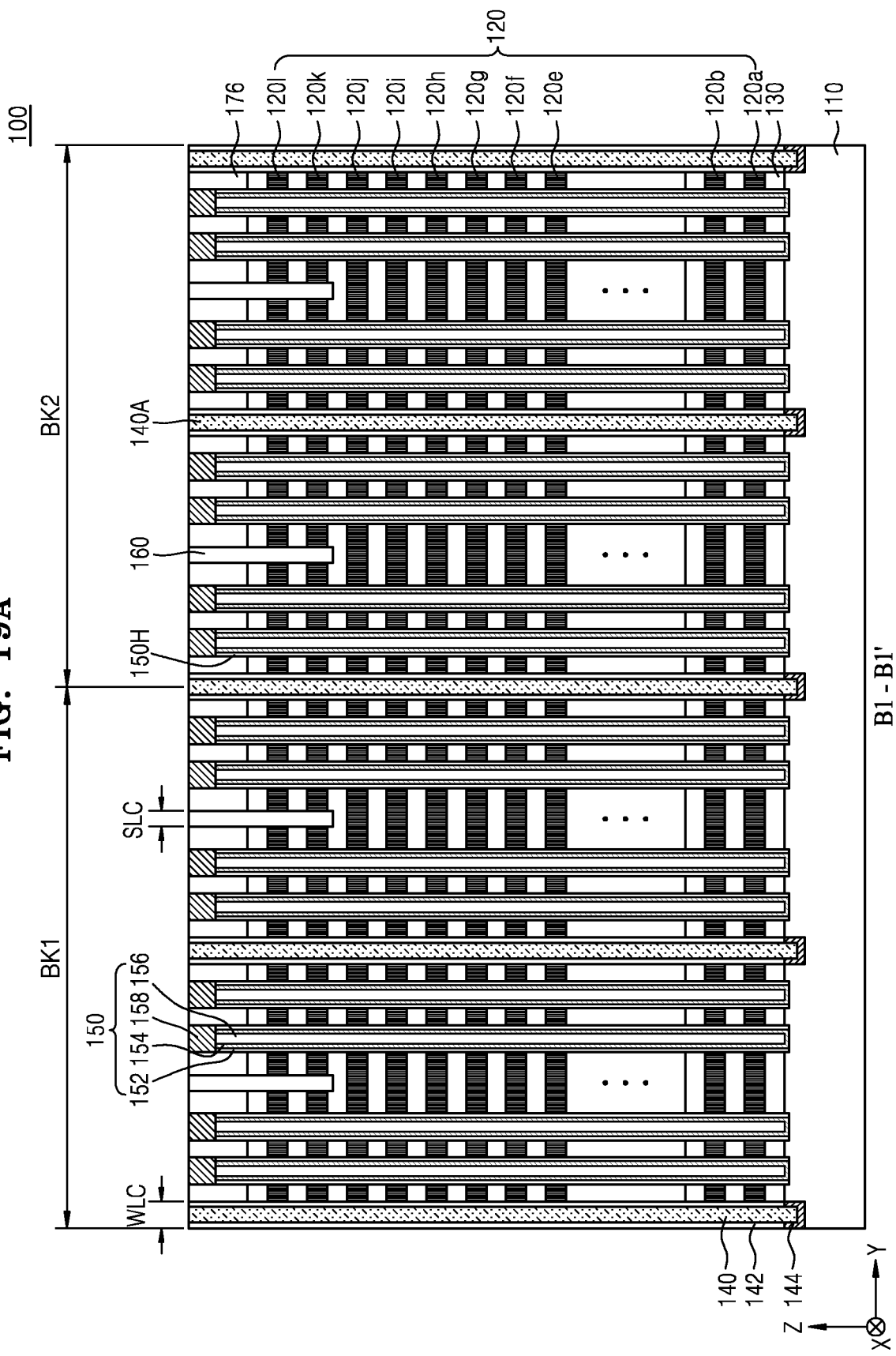

SEMICONDUCTOR DEVICE

CROSS-REFERENCE TO RELATED APPLICATIONS

This application is a continuation of U.S. patent application Ser. No. 16/520,979 filed Jul. 24, 2019, which claims priority under 35 U.S.C. § 119 to Korean Patent Application No. 10-2018-0135332, filed on Nov. 6, 2018 in the Korean Intellectual Property Office, the disclosures of which are incorporated by reference herein in their entirety.

TECHNICAL FIELD

Exemplary embodiments of the inventive concept relate to a semiconductor device, and more particularly, to a semiconductor device including a channel structure extending in a vertical direction.

DISCUSSION OF THE RELATED ART

As the degree of integration of memory devices increases, memory devices having a vertical transistor structure have been proposed instead of memory devices having a planar transistor structure. Memory devices having a vertical transistor structure include a channel structure which extends in a vertical direction on a substrate. However, as the degree of integration of memory devices increases, the number of gate electrode layers stacked in the vertical direction increases. As a result, the level of difficulty in a manufacturing process increases.

SUMMARY

Exemplary embodiments of the inventive concept provide a semiconductor device capable of preventing a void from being formed in a pad part (or reducing the size of a void that may be formed). As a result, a pad contact defect may be prevented, or the occurrence of a pad contact defect may be reduced, thereby enhancing an electrical characteristic of the semiconductor device despite the device having a high degree of integration.

According to an exemplary embodiment of the inventive concept, a semiconductor device includes a substrate including a memory cell region and a connection region, a plurality of gate electrodes disposed in the memory cell region and the connection region, a plurality of channel structures passing through the plurality of gate electrodes and extending from an upper surface of the substrate in a vertical direction in the memory cell region, and a plurality of pad layers extending in a first direction parallel to the upper surface of the substrate from each of the plurality of gate electrodes in the connection region. The plurality of pad layers is disposed in a stepped form in a second direction parallel to the upper surface of the substrate and crossing the first direction. The semiconductor device further includes a plurality of dummy lines arranged in one row in the first direction between two pad layers adjacent to each other in the second direction, and disposed apart from one another with a pad connection region disposed therebetween in the first direction. The pad connection region vertically overlaps two pad layers successively disposed in the first direction.

According to an exemplary embodiment of the inventive concept, a semiconductor device includes a plurality of gate electrodes disposed on a substrate. The gate electrodes are disposed apart from one another in a vertical direction perpendicular to an upper surface of the substrate. The semiconductor device further includes a plurality of channel structures disposed on the substrate, passing through the plurality of gate electrodes, and extending in the vertical direction. The semiconductor device further includes a first pad layer extending in a first direction parallel to the upper surface of the substrate from one of the plurality of gate electrodes, a second pad layer disposed adjacent to the first pad layer in the first direction and extending in the first direction from another gate electrode of the plurality of gate electrodes, a first pad contact disposed on the first pad layer, a second pad contact disposed on the second pad layer, a first dummy line disposed adjacent to the first pad layer in a second direction parallel to an upper surface of the substrate and vertical to the first direction and extending in the first direction, and a second dummy line disposed adjacent to the second pad layer and spaced apart from the first dummy line in the first direction. An edge of the first dummy line is disposed between the second pad contact and a center of the first pad contact, and an edge of the second dummy line is disposed between the first pad contact and a center of the second pad contact.

According to an exemplary embodiment of the inventive concept, a semiconductor device includes a plurality of gate electrodes disposed on a substrate. The gate electrodes are disposed apart from one another in a vertical direction perpendicular to an upper surface of the substrate. The semiconductor device further includes a plurality of channel structures disposed on the substrate, passing through the plurality of gate electrodes, and extending in the vertical direction. The semiconductor device further includes a first pad layer extending in a first direction parallel to the upper surface of the substrate from one of the plurality of gate electrodes, a second pad layer disposed adjacent to the first pad layer in the first direction and extending in the first direction from another gate electrode of the plurality of gate electrodes, a first pad contact disposed on the first pad layer, a second pad contact disposed on the second pad layer, and a first dummy line disposed adjacent to the first pad layer in a second direction parallel to an upper surface of the substrate and crossing the first direction, and extending in the first direction. The semiconductor device further includes a second dummy line disposed adjacent to the second pad layer and spaced apart from the first dummy line in the first direction. An edge of the first dummy line is closer to an edge of the first pad layer than a center of the first pad contact is, and an edge of the second dummy line is closer to the edge of the first pad layer than a center of the second pad contact is.

BRIEF DESCRIPTION OF THE DRAWINGS

The above and other features of the present inventive concept will become more apparent by describing in detail exemplary embodiments thereof with reference to the accompanying drawings, in which:

FIGS. 15A, 15B, 16A, 16B, 17A, 17B, 18A, 18B, 19A, and 19B are cross-sectional views illustrating a method of manufacturing a semiconductor device in a process sequence, according to exemplary embodiments.

DETAILED DESCRIPTION OF THE EXEMPLARY EMBODIMENTS

Figure 1:
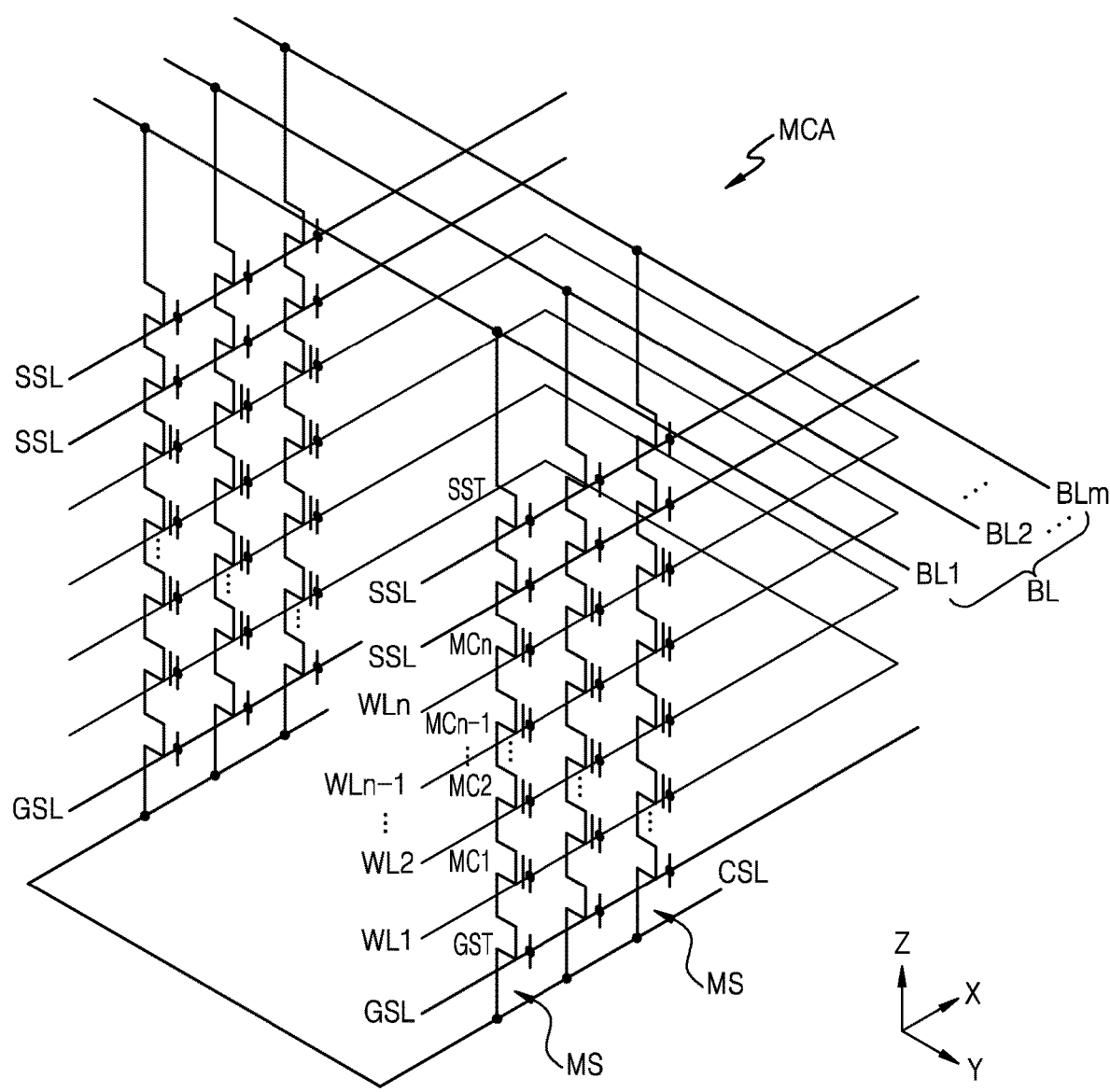
FIG. 1 is an equivalent circuit diagram of a memory cell array of a semiconductor device according to exemplary embodiments.

Exemplary embodiments of the present inventive concept will be described hereinafter with reference to the accompanying drawings. Like reference numerals may refer to like elements throughout the accompanying drawings.

FIG. 1 is an equivalent circuit diagram of a memory cell array MCA of a semiconductor device according to exemplary embodiments. For example, FIG. 1 is an equivalent circuit diagram of a vertical NAND (VNAND) flash memory device having a vertical channel structure.

Referring to FIG. 1, the memory cell MCA may include a plurality of memory cell strings MS which are arranged in a vertical direction (a Z direction of FIG. 1) on a substrate. Each of the plurality of memory cell strings MS may include a plurality of memory cells MC1 to MCn, a string selection transistor SST, and a ground selection transistor GST, which are serially connected to one another. The plurality of memory cells MC1 to MCn may store data, and a plurality of word lines WL1 to WLn may be respectively connected to the plurality of memory cells MC1 to MCn. Each of the plurality of word lines WL1 to WLn may control a corresponding memory cell of the plurality of memory cells MC1 to MCn. n is a positive integer.

A gate terminal of the ground selection transistor GST may be connected to a ground selection line GSL, and a source terminal of the ground selection transistor GST may be connected to a common source line CSL. A gate terminal of the string selection transistor SST may be connected to a string selection line SSL, a source terminal of the string selection transistor SST may be connected to a drain terminal of the memory cell MCn, and a drain terminal of the string selection transistor SST may be connected to a plurality of bit lines BL1 to BLm (BL). m is a positive integer. In FIG. 1, each of the memory cell strings MS is illustrated as including one ground selection transistor GST and two string selection transistors SST. However, exemplary embodiments of the present inventive concept are not limited thereto. For example, in exemplary embodiments, each of the ground selection transistor GST and the string selection transistor SST included in each memory cell string MS may be provided as one or provided as three or more.

When a signal is applied to the gate terminal of the string selection transistor SST through the string selection line SSL, a signal applied through the plurality of bit lines BL may be provided to the plurality of memory cells MC1 to MCn, and thus, a write operation may be performed. When a signal is applied to the gate terminal of the ground selection transistor SST through the ground selection line GSL, an erase operation may be performed on the plurality of memory cells MC1 to MCn.

FIGS. 2 to 9 are diagrams illustrating a semiconductor device 100 according to exemplary embodiments.

Figure 2:
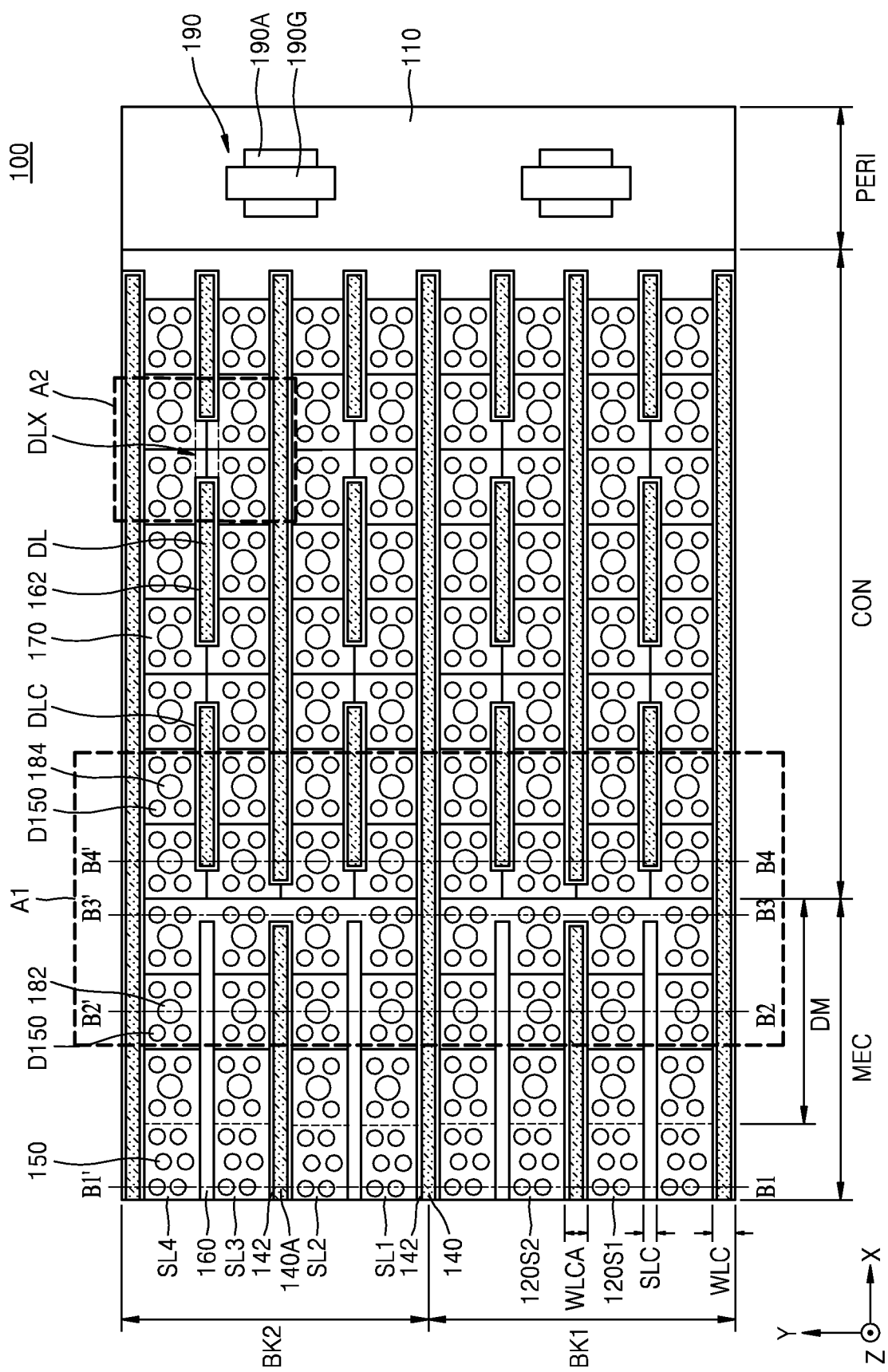
FIG. 2 is a plan view illustrating a representative configuration of a semiconductor device according to exemplary embodiments.
Figure 3:
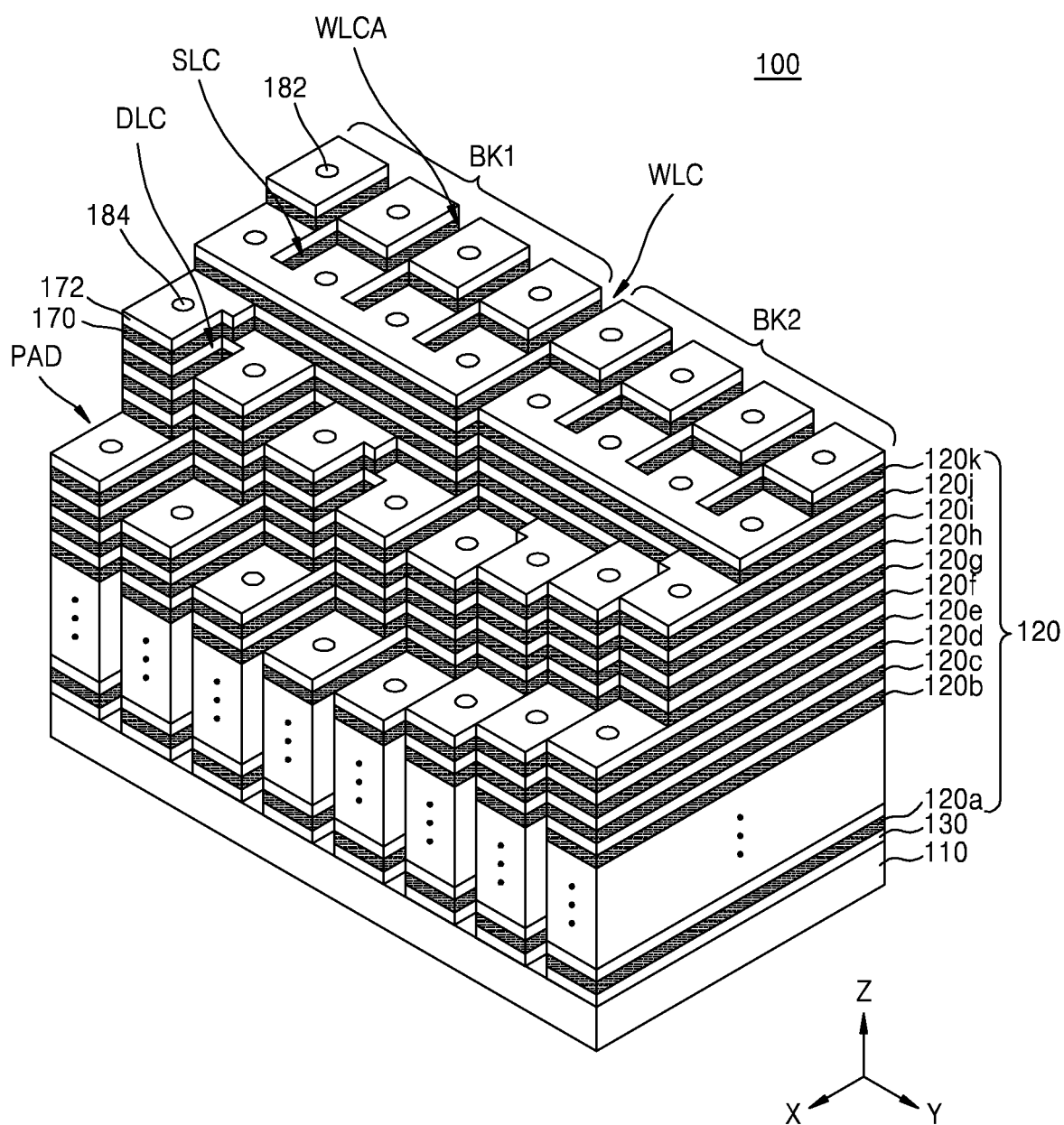
FIG. 3 is a perspective view illustrating region A1 of FIG. 2.
Figure 4:
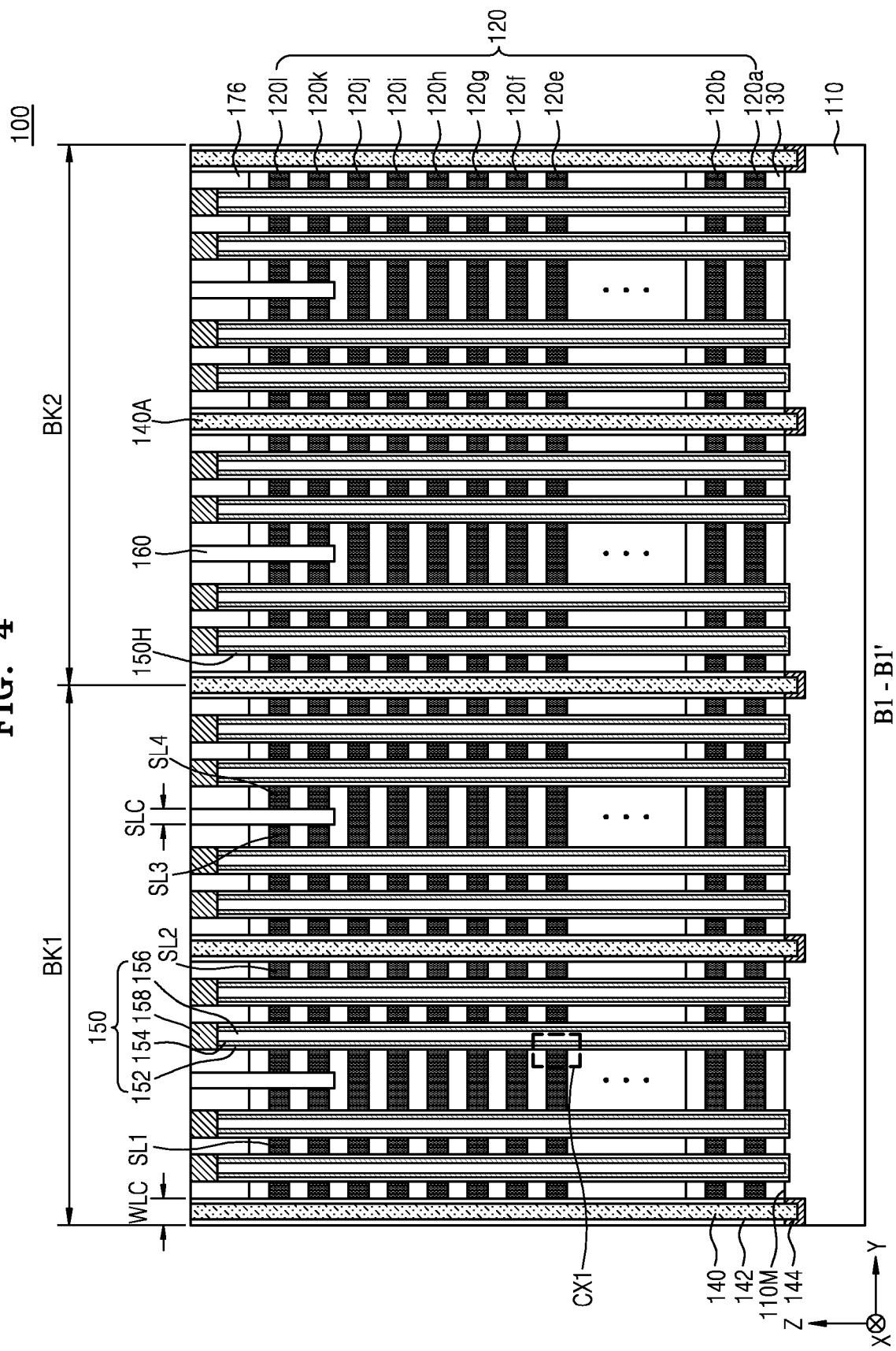
FIG. 4 is a cross-sectional view taken along line B1-B1' of FIG. 2.
Figure 5:
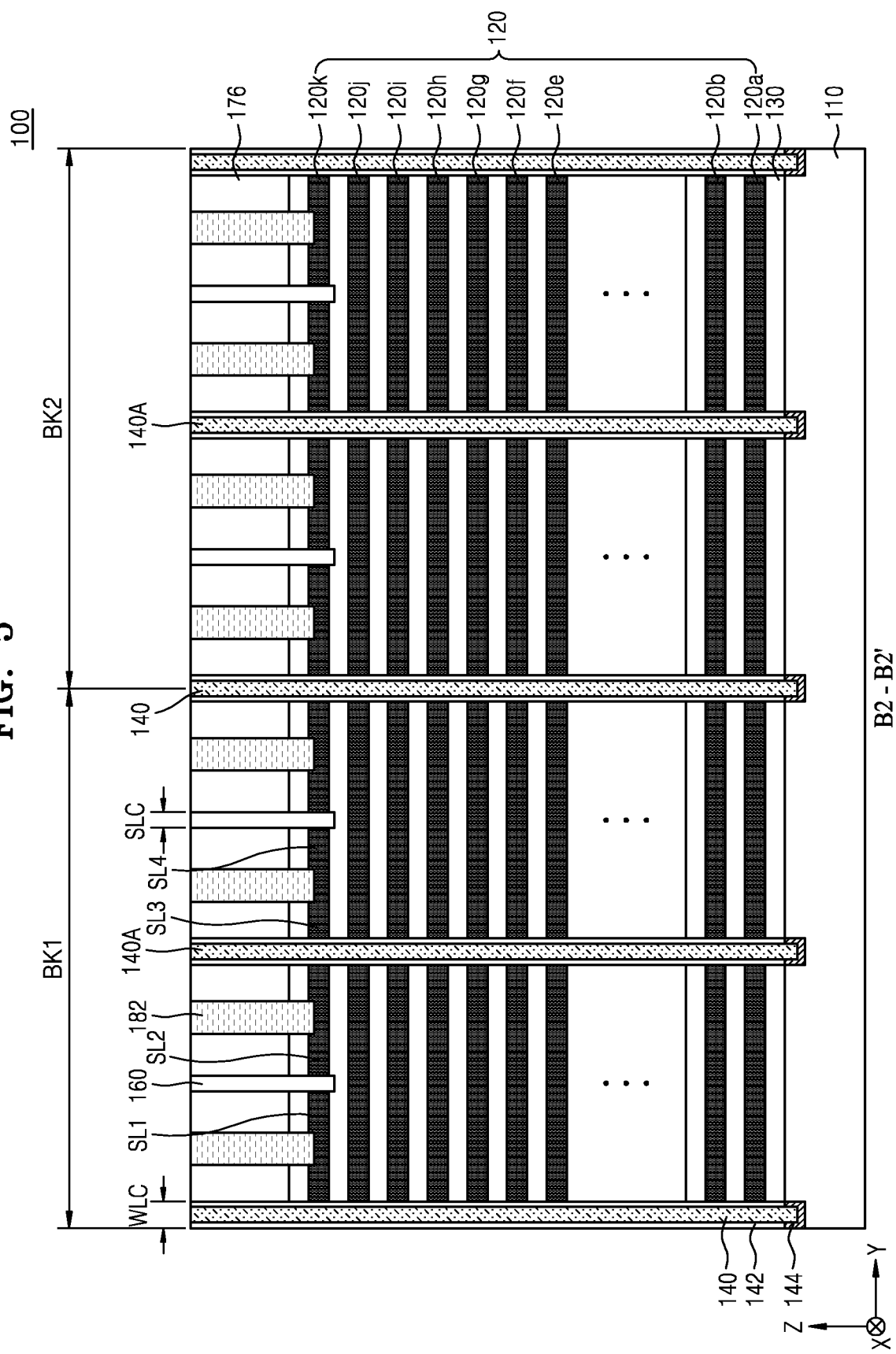
FIG. 5 is a cross-sectional view taken along line B2-B2' of FIG. 2.
Figure 6:
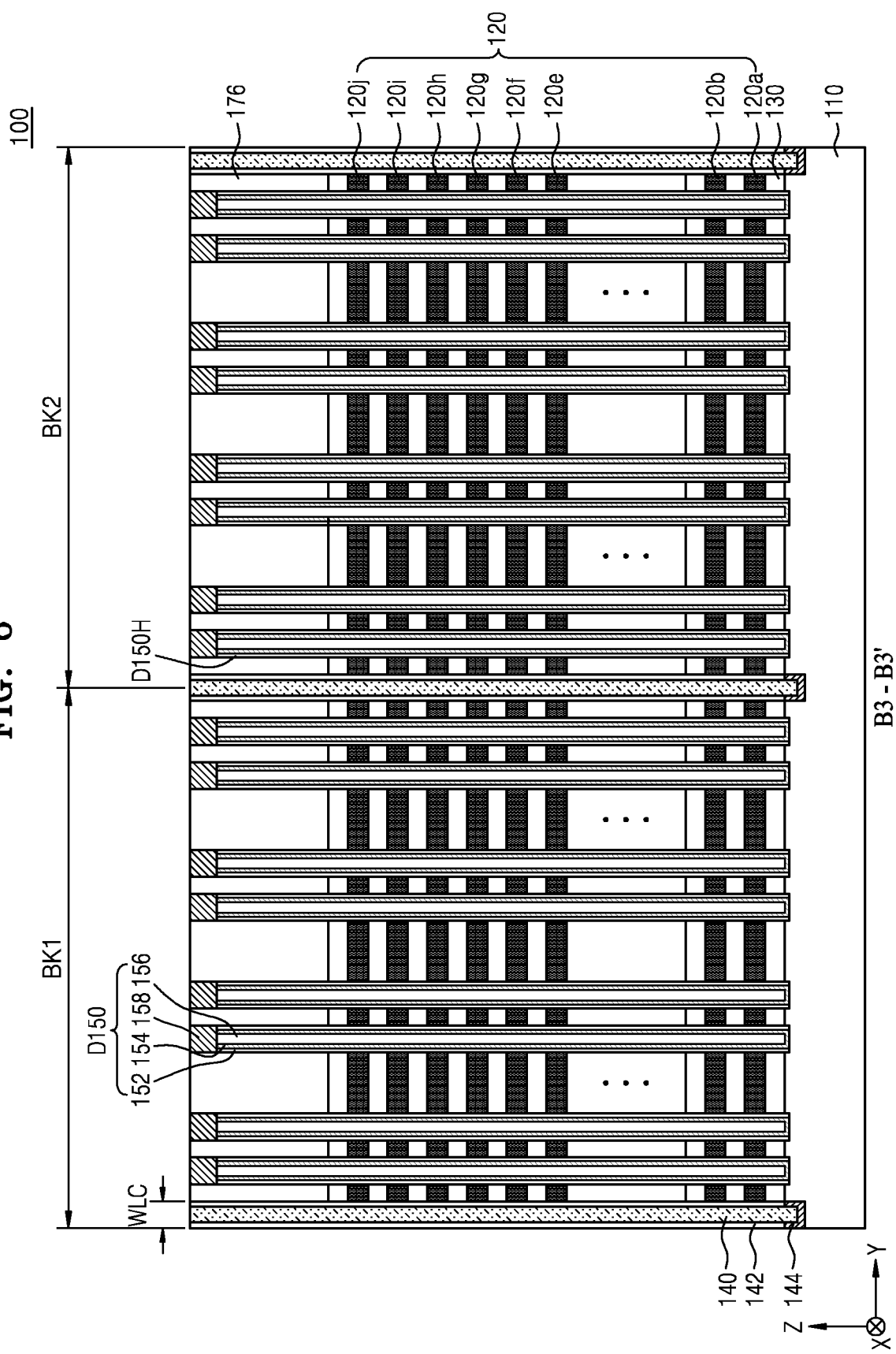
FIG. 6 is a cross-sectional view taken along line B3-B3' of FIG. 2.
Figure 7:
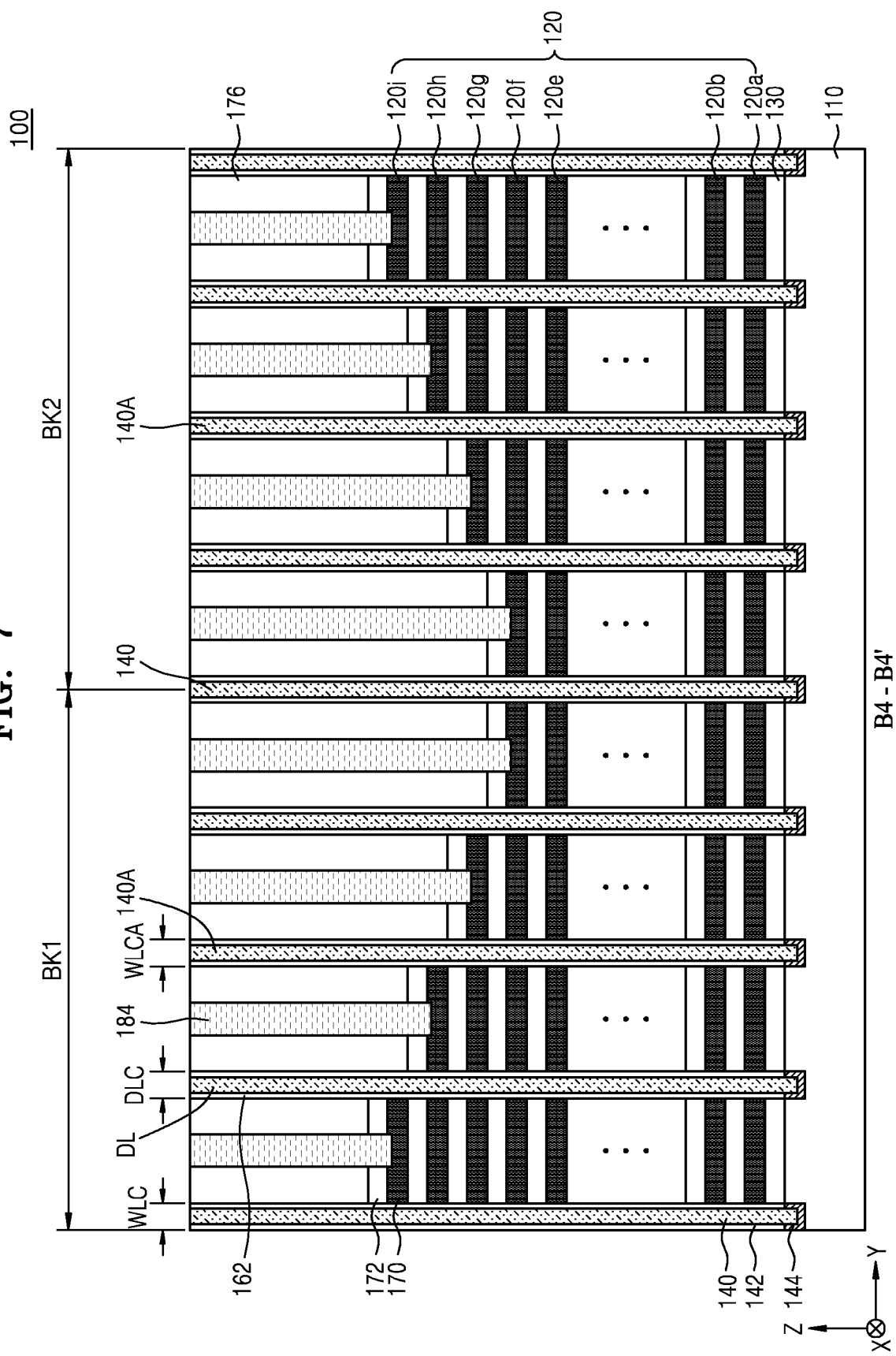
FIG. 7 is a cross-sectional view taken along line B4-B4' of FIG. 2.
Figure 8:
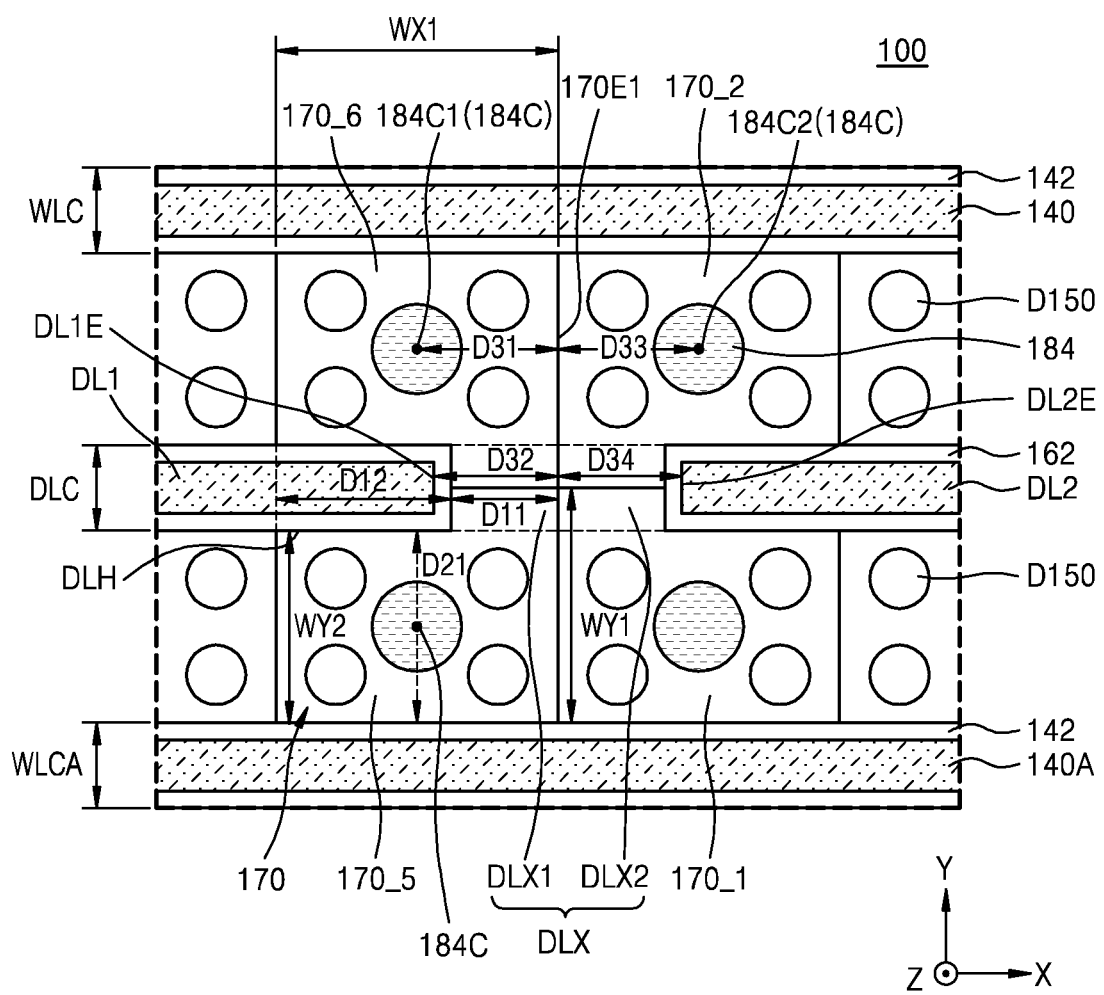
FIG. 8 is a plan view illustrating region A2 of FIG. 2.
Figure 9:
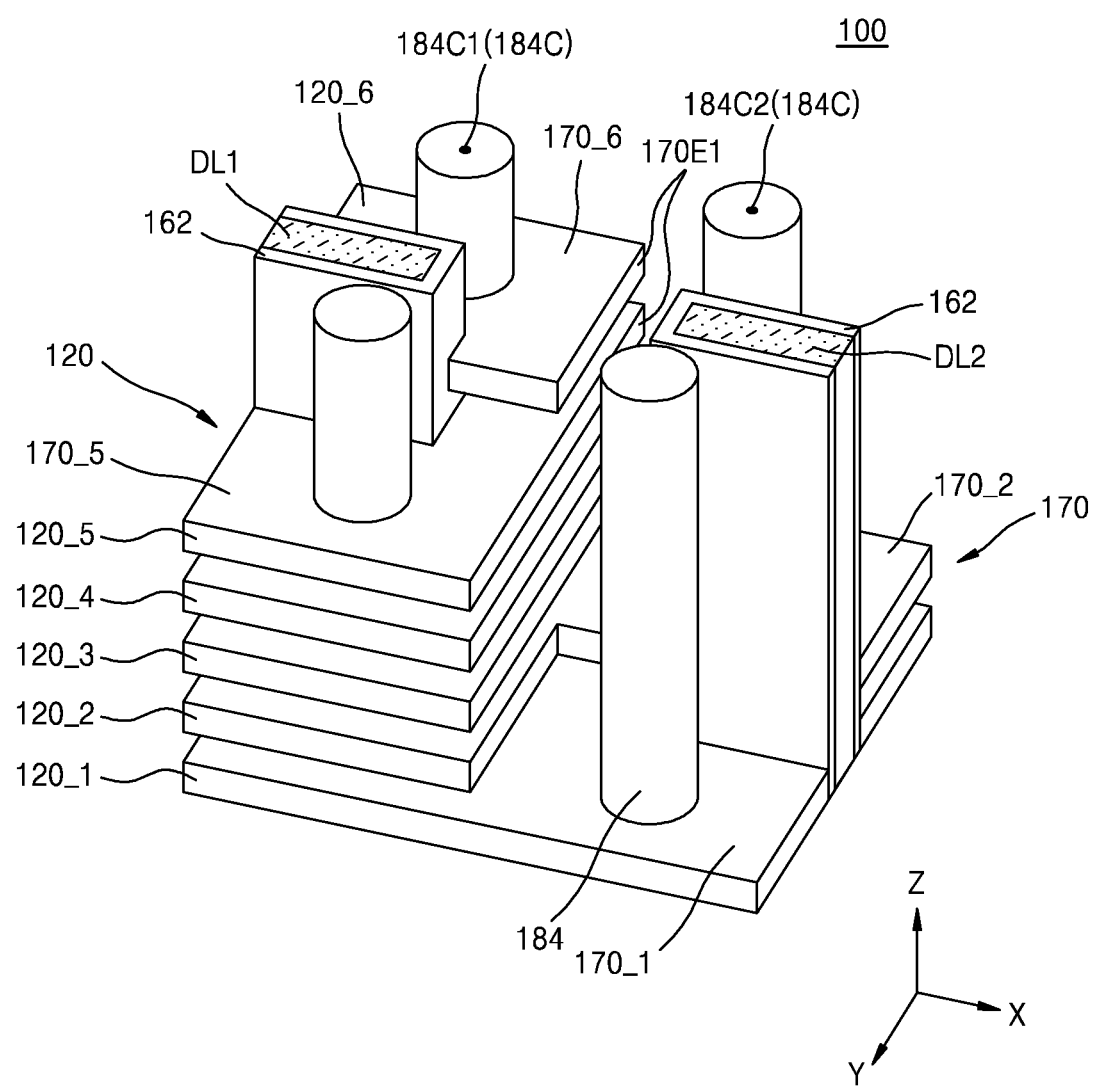
FIG. 9 is a perspective view illustrating region A2 of FIG. 2.

FIG. 2 is a plan view illustrating a representative configuration of the semiconductor device 100 according to exemplary embodiments. FIG. 3 is a perspective view illustrating region A1 of FIG. 2. FIG. 4 is a cross-sectional view taken along line B1-B1' of FIG. 2. FIG. 5 is a cross-sectional view taken along line B2-B2' of FIG. 2. FIG. 6 is a cross-sectional view taken along line B3-B3' of FIG. 2. FIG. 7 is a cross-sectional view taken along line B4-B4' of FIG. 2. FIG. 8 is a plan view illustrating region A2 of FIG. 2. FIG. 9 is a perspective view illustrating region A2 of FIG. 2. In FIGS. 3 and 9, only some elements of the semiconductor device 100 are schematically illustrated for convenience of illustration.

Referring to FIGS. 2 to 9, a substrate 110 may include a memory cell region MEC, a connection region CON, and a peripheral circuit region PERI. A memory cell array MCA may be disposed in the memory cell region MEC. The memory cell array MCA may be a NAND memory device which has a vertical channel structure and is driven in a manner described above with reference to FIG. 1. A peripheral circuit transistor 190 that drives the memory cell array MCA may be disposed in the peripheral circuit region PERI. The peripheral circuit transistor 190 may include a peripheral circuit active region 190A and a peripheral circuit gate electrode 190G disposed in the peripheral circuit active region 19s0A. The connection region CON may be a region in which a pad part PAD that connects the peripheral circuit transistor 190 to the memory cell array MCA disposed in the memory cell region MEC is provided.

The substrate 110 may include a main surface 110M extending in a first horizontal direction (an X direction) and a second horizontal direction (a Y direction). The first horizontal direction (the X direction) and the second horizontal direction (the Y direction) may extend parallel to the main surface 110M. The second horizontal direction (the Y direction) crosses (e.g., is perpendicular to) the first horizontal direction (the X direction). The substrate 110 may include a semiconductor material (for example, a Group IV semiconductor, a Group III-V compound semiconductor, or a Group II-VI oxide semiconductor). Examples of the Group IV semiconductor may include silicon (Si), germanium (Ge), or Si—Ge. The substrate 110 may be provided as a bulk wafer or an epitaxial layer. In an exemplary embodiment, the substrate 110 may include a silicon-on-insulator (SOI) substrate or a germanium-on-insulator (GeOI) substrate.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

A plurality of gate electrodes 120 may be provided on the substrate 110. The plurality of gate electrodes 120 may extend in the first horizontal direction (the X direction) and the second horizontal direction (the Y direction) parallel to the main surface 110M of the substrate 110, and may be spaced apart from one another in a vertical direction vertical to the main surface 110M of the substrate 110.

In exemplary embodiments, the plurality of gate electrodes 120 may correspond to a ground selection line GSL, a plurality of word lines WL1 to WLn, and a string selection line SSL which configure a memory cell string MS (see FIG. 1). For example, a lowermost gate electrode 120a may function as the ground selection line GSL, two uppermost gate electrodes 120k and 120l may function as the string selection line SSL, and the other gate electrodes 120b to 120j may function as the word lines WL1 to WLn. In exemplary embodiments, an uppermost gate electrode 120j of the other gate electrodes 120b to 120j may function as a dummy word line. Therefore, the memory cell string MS including the ground selection transistor GST, the string selection transistor SST, and a plurality of memory cell transistors MC1 to MCn serially connected to one another therebetween may be provided.

A plurality of insulation layers 130 may be provided. One of the plurality of insulation layers 130 may be disposed between the substrate 110 and the lowermost gate electrode 120a, and the other insulation layers 130 may each be disposed between two adjacent gate electrodes of the plurality of gate electrodes 120. Another insulation layer 130 may be disposed on the uppermost gate electrode 120l. An interlayer insulation layer 176 may be disposed on an uppermost insulation layer 130.

As exemplarily illustrated in FIG. 2, a plurality of word line cut regions WLC may be provided on the substrate 110, and may extend in the first horizontal direction (the X direction) parallel to the main surface 110M of the substrate 110. Gate electrodes 120 disposed between a pair of word line cut regions WLC among the plurality of gate electrodes 120 may configure a first block BK1, and gate electrodes 120 disposed between another pair of word line cut regions WLC among the plurality of gate electrodes 120 may configure a second block BK2. A pair of word line cut regions WLC may limit a width in the second horizontal direction (the Y direction) of the plurality of gate electrodes 120.

A middle word line cut region WLCA may be disposed between a pair of word line cut regions WLC in the first horizontal direction (the X direction). The middle word line cut region WLCA may extend to an edge of the memory cell region MEC (e.g., a dummy cell region DM which is a portion of the memory cell region MEC adjacent to the connection region CON). In the memory cell region MEC, the plurality of gate electrodes 120 may be divided into a first portion 120S1 and a second portion 120S2 by the middle word line cut region WLCA. In the dummy cell region DM, the first portion 120S1 may be connected to the second portion 120S2 by the middle word line cut region WLCA.

A plurality of common source lines 140 vertically overlapping a plurality of word line cut regions WLC may be disposed on the substrate 110 in the first horizontal direction (the X direction). A plurality of middle common source lines 140A vertically overlapping the middle word line cut region WLCA may be disposed on the substrate 110 in the first horizontal direction (the X direction). An insulation spacer 142 may be disposed on both sidewalls of each of the plurality of common source lines 140 and both sidewalls of each of the plurality of middle common source lines 140A. For example, the insulation spacer 142 may be disposed between the plurality of common source lines 140 and the plurality of gate electrodes 120 and between the plurality of middle common source lines 140A and the plurality of gate electrodes 120. The plurality of common source lines 140 and the plurality of middle common source lines 140A may extend to a level which is lower in position than the main surface 110M of the substrate 110.

A plurality of common source regions 144 may be disposed in the first horizontal direction (the X direction) inside the substrate 110 under the common source lines 140. Each of the plurality of common source regions 144 may be an impurity region which is doped with n-type impurities at a high concentration. Each of the plurality of common source regions 144 may function as a source region which supplies a current to memory cells. The plurality of common source regions 144 may be respectively disposed at positions overlapping the plurality of word line cut regions WLC.

As illustrated in FIG. 4, the common source lines 140 may be disposed on side surfaces of the plurality of gate electrodes 120, and upper surfaces of the common source lines 140 may be disposed on a level which is higher in position than an upper surface of the uppermost gate electrode 120l. However, exemplary embodiments of the inventive concept are not limited thereto. For example, in exemplary embodiments, heights of the common source lines 140 may be appropriately set so that the upper surfaces of the common source lines 140 are disposed on a level which is lower in position than a bottom of the uppermost gate electrode 120l, or are disposed on a level which is lower in position than the upper surface of the uppermost gate electrode 120l.

As illustrated in FIGS. 2 and 4, in the memory cell region MEC, a plurality of channel structures 150 may pass through the plurality of gate electrodes 120 and may extend from the main surface 110M of the substrate 110 in the vertical direction (the Z direction). The main surface 110M of the substrate 110 may also be referred to as an upper surface of the substrate 110. The plurality of channel structures 150 may be arranged in the first horizontal direction (the X direction), the second horizontal direction (the Y direction), and a third horizontal direction (for example, a diagonal direction), and may be spaced apart from one another at certain intervals. The plurality of channel structures 150 may be arranged in a zigzag form or a staggered form.

Each of the plurality of channel structures 150 may be disposed in a channel hole 150H which passes through the plurality of gate electrodes 120, the insulation layers 130, and the interlayer insulation layer 176. A gate insulation layer 152 and a channel layer 154 may be sequentially disposed on an inner wall of the channel hole 150H, and a buried insulation layer 156 filling a remaining space of the channel hole 150H may be disposed on the channel layer 154. A conductive plug 158, which contacts the channel layer 154 and plugs an inlet of the channel hole 150H, may be disposed on the channel hole 150H. In exemplary embodiments, the buried insulation layer 156 may be omitted, and the channel layer 154 may be formed in a pillar shape which fills a remaining portion of the channel hole 150H.

As illustrated in FIGS. 2 and 6, in the dummy cell region DM and the connection region CON, each of a plurality of dummy channel structures D150 may be disposed in a dummy channel hole D150H which passes through the plurality of gate electrodes 120, the insulation layers 130, and the interlayer insulation layer 176. The plurality of dummy channel structures D150 may each have a structure similar to that of each of the plurality of channel structures 150. A height of a sidewall, surrounded by the interlayer insulation layer 176, of each of some of the plurality of dummy channel structures D150 disposed in the connection region CON may be greater than that of a sidewall of each of the channel structures 150 surrounded by the interlayer insulation layer 176. The plurality of dummy channel structures D150 may secure the structural stability of the semiconductor device 100 in a process of manufacturing the semiconductor device 100.

In the first and second blocks BK1 and BK2, each of the two uppermost gate electrodes 120k and 120l may be divided into four lines by a string separation insulation layer 160 and a corresponding middle common source line 140A, in a plan view. The four lines may be referred to as first to fourth string separation regions SL1 to SL4. For example, a string selection line cut region SLC may extend in the first horizontal direction (the X direction) between a corresponding word line cut region WLC and the middle word line cut region WLCA, and the string separation insulation layer 160 may be disposed in the string selection line cut region SLC.

In the connection region CON, the plurality of gate electrodes 120 may extend to configure the pad part PAD. In the connection region CON, the plurality of gate electrodes 120 may extend to have a reduced length in the first horizontal direction (the X direction) as the gate electrodes 120 are away from the main surface 110M of the substrate 110. As illustrated in FIG. 3, four gate electrodes 120f to 120i, which are sequentially stacked, may have the same length in the first horizontal direction (the X direction), and upper surfaces of the four gate electrodes 120f to 120i may be disposed in a stepped form in the first horizontal direction (the X direction). A shape of a pad part PAD provided in the first block BK1 and a shape of a pad part PAD provided in the second block BK2 may be mirror-symmetrical. In exemplary embodiments, a shape of the pad part PAD provided in the first block BK1 and a shape of the pad part PAD provided in the second block BK2 may be the same.

Figure 11:
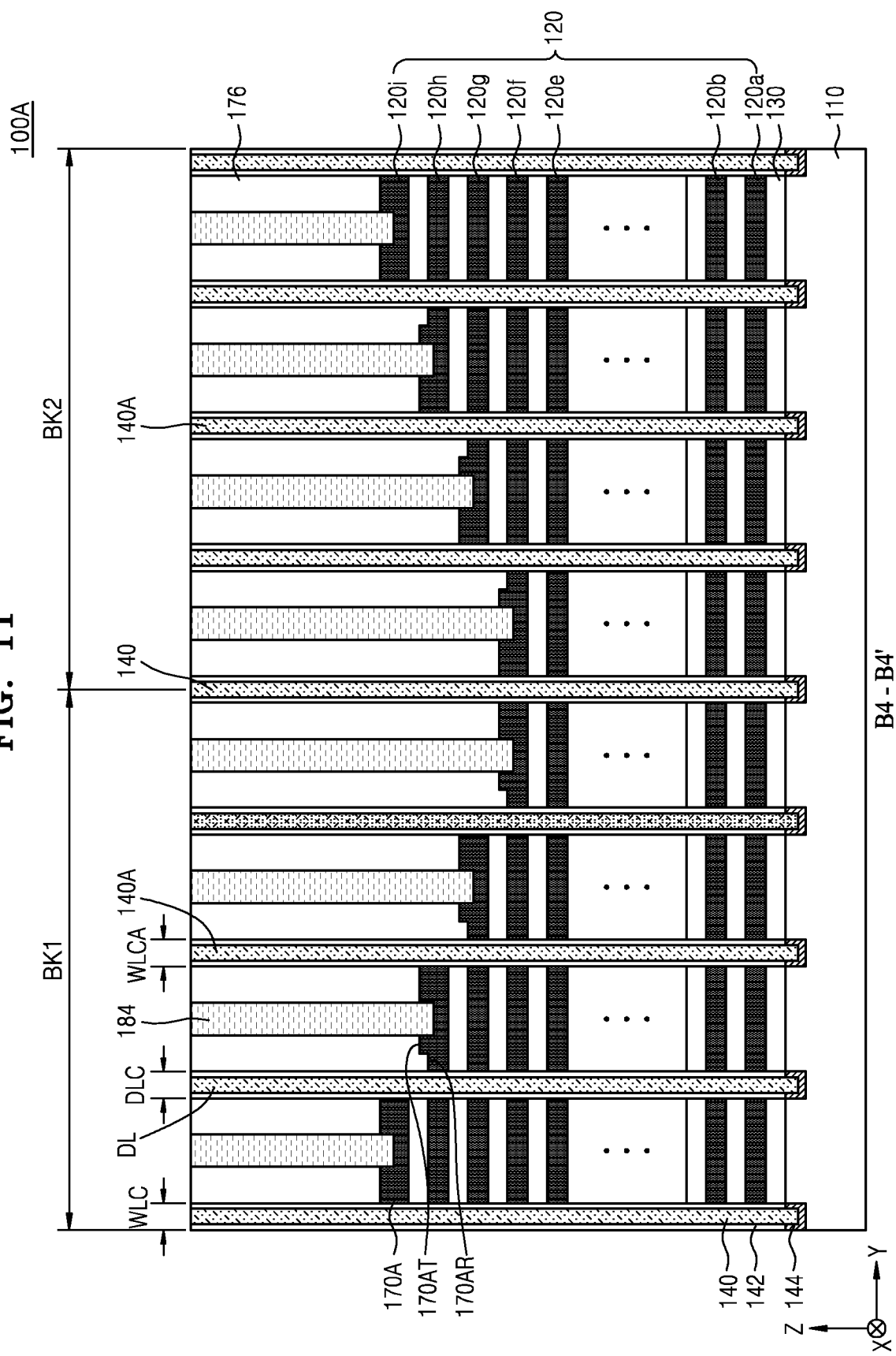
FIG. 11 is a cross-sectional view illustrating a semiconductor device according to exemplary embodiments.

The pad part PAD may include a plurality of pad layers 170 and a plurality of pad insulation layers 172. In the connection region CON, each of outermost portions of the gate electrodes 120 disposed in a stepped form may be referred to as a pad layer 170. The pad insulation layers 172 may be disposed on the pad layers 170 to completely cover upper surfaces of the pad layers 170, respectively. Each of the pad insulation layers 172 may extend from a corresponding insulation layer 130 and may denote a portion of the corresponding insulation layer 130 vertically overlapping a corresponding pad layer 170. In exemplary embodiments, however, each of the pad insulation layers 172 may be spaced apart from a corresponding insulation layer 130 and may be disposed on at least a portion of a corresponding pad layer 170, or the pad insulation layers 172 may be omitted. It is illustrated that each of the pad layers 170 has the same vertical-direction (Z-direction) thickness over a whole area thereof. However, exemplary embodiments are not limited thereto. For example, in exemplary embodiments, as illustrated in FIG. 11, a portion of each of the pad layers 170 may be provided to have a vertical-direction thickness which is greater than a thickness of another portion thereof.

The pad layers 170 may extend in the first horizontal direction (the X direction), and may extend from the plurality of gate electrodes 120. Further, as shown in FIGS. 3 and 7, the pad layers 170 may be disposed in a stepped form in the second horizontal direction (the Y direction).

In the dummy cell region DM, a cell contact 182 which passes through the interlayer insulation layer 176 and the insulation layers 130 may be disposed in each of the gate electrodes 120, and may be electrically connected to the first to fourth string separation regions SL1 to SL4. In the contact region CON, a pad contact 184 which passes through the interlayer insulation layer 176 and the pad insulation layers 172 may be provided and may be electrically connected to a corresponding pad layer 170. As exemplarily illustrated in FIG. 7, the four gate electrodes 120f to 120i, which are sequentially stacked, may be disposed in a stepped form in the second horizontal direction (the Y direction), and thus, four pad contacts 184 respectively connected to the four gate electrodes 120f to 120i may have different vertical-direction (Z-direction) heights.

Figure 13:
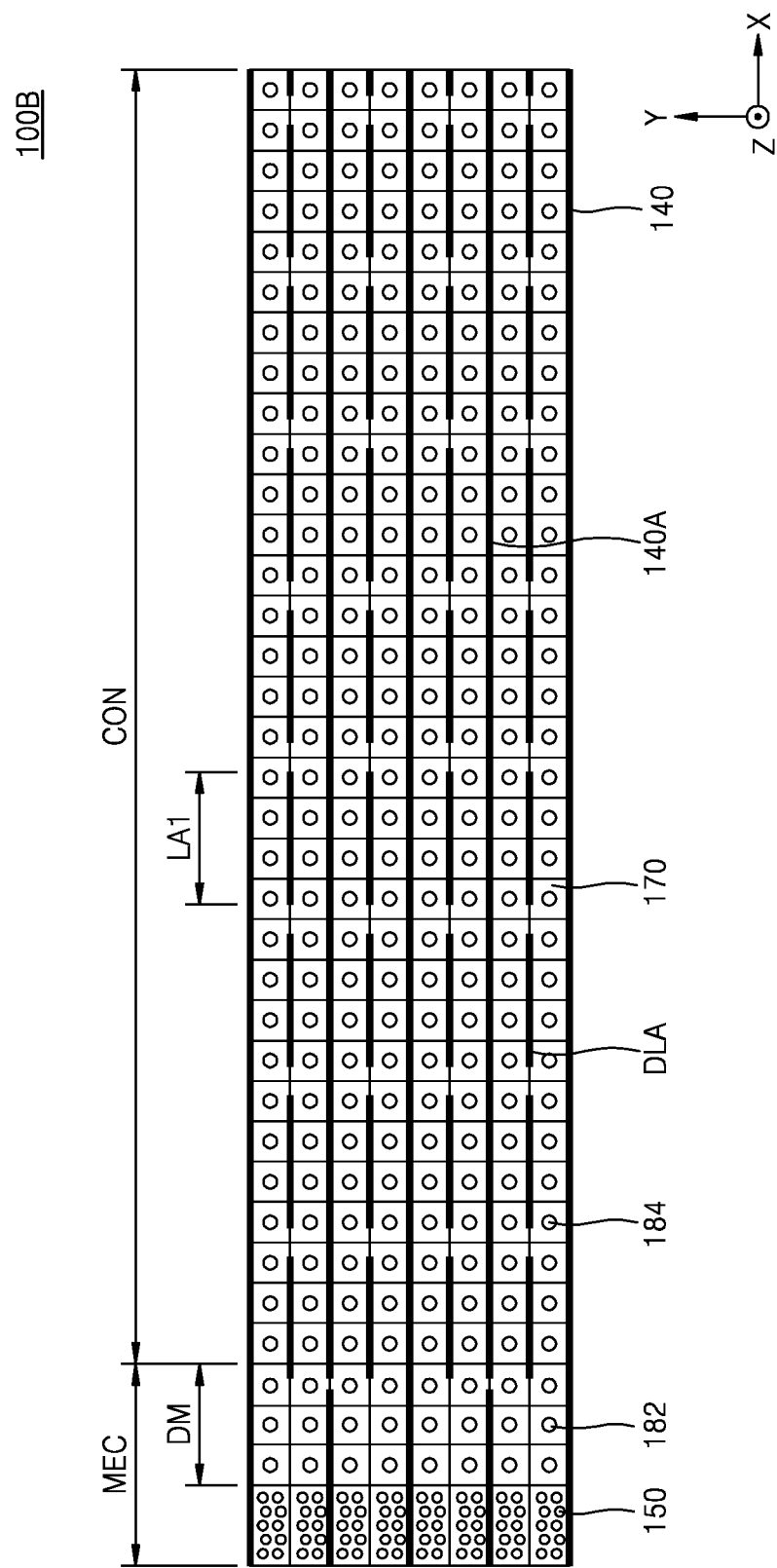
FIG. 13 is a plan view illustrating a semiconductor device according to exemplary embodiments.

In the connection region CON, the middle word line cut region WLCA may extend in the first horizontal direction (the X direction) between a pair of word lines WLC, and thus, the plurality of gate electrodes 120 may be divided into the first portion 120S1 and the second portion 120S2 by the middle word line cut region WLCA. As illustrated in FIG. 2, the first portion 120S1 and the second portion 120S2 may be connected to each other in a portion of the connection region CON adjacent to the dummy cell region DM. However, exemplary embodiments of the present inventive concept are not limited thereto. For example, as illustrated in FIG. 13, in an exemplary embodiment, the first portion 120S1 and the second portion 120S2 may be connected to each other in only the dummy cell region DM and may be disposed apart from each other in a whole area of the connection region CON.

In the connection region CON, a plurality of dummy line cut regions DLC may be disposed apart from one another in each of the first portion 120S1 and the second portion 120S2, and a plurality of dummy lines DL may be disposed in the plurality of dummy line cut regions DLC. A dummy line insulation layer 162 may be further disposed on a sidewall of each of the plurality of dummy lines DL. For example, each of the plurality of dummy lines DL may be formed by forming the dummy line insulation layer 162 on an inner wall of a dummy line opening DLH, passing through the plurality of gate electrodes 120, and filling a metal material into the dummy line opening DLH on the dummy line insulation layer 162. Each of the plurality of dummy lines DL may include an upper surface which is disposed on the same level as upper surfaces of the plurality of common source lines 140 and the plurality of middle common source lines 140A. For example, the plurality of dummy lines DL may be formed simultaneously in a process of forming the plurality of common source lines 140 and the plurality of middle common source lines 140A.

A pad connection region DLX may be disposed between two adjacent dummy lines DL of the plurality of dummy lines DL. For example, a dummy line DL, a pad connection region DLX, a dummy line DL, a pad connection region DLX, and a dummy line DL may be sequentially arranged in the first horizontal direction (the X direction). Each of a plurality of pad connection regions DLX may be disposed between the plurality of dummy line cut regions DLC, and portions of the gate electrodes 120 overlapping a corresponding pad connection region DLX may be connected to each other without being separated therefrom. As a result, the gate electrodes 120 provided in the connection region CON may be prevented from being bent or from leaning by stress caused by a high temperature applied thereto in a manufacturing process.

FIGS. 8 and 9 illustrate an enlarged plan view and a perspective view of first and second dummy lines DL1 and DL2, which are adjacent to each other, of the plurality of dummy lines DL, and a portion of the connection region CON including six gate electrodes 120_1 to 120_6 surrounding a portion of a sidewall of each of the first and second dummy lines DL1 and DL2. In the perspective view of FIG. 9, for convenience of illustration, the dummy channel structures D150 provided in the dummy channel hole D150H, the insulation layer 130, and the pad insulation layer 172 are omitted.

As exemplarily illustrated in FIGS. 8 and 9, the first and second dummy lines DL1 and DL2 may be disposed apart from each other in the first horizontal direction (the X direction) with a pad connection region DLX disposed therebetween. The pad connection region DLX may include a first pad connection region DLX1 and a second pad connection region DLX2. The plurality of pad layers 170 may include first to fourth pad layers 170_1, 170_2, 170_5, and 170_6 which respectively extend from the gate electrodes 120_1, 120_2, 120_5, and 120_6.

In exemplary embodiments, adjacent dummy lines DL may be arranged in a row in the first horizontal direction (the X direction) between two pad layers 170 adjacent to each other in the second horizontal direction (the Y direction), and the pad connection region DLX may be disposed between the adjacent dummy lines DL. For example, as shown in FIG. 8, in an exemplary embodiment, dummy lines DL1 and DL2 may be arranged in one row in the first horizontal direction (the X direction) between two pad layers adjacent to each other in the second horizontal direction (the Y direction) (e.g., pad layers 170_5 and 170_6, and pad layers 170_1 and 170_2). The dummy lines DL1 and DL2 may be disposed apart from one another with the pad connection region DLX disposed therebetween in the first horizontal direction (the X direction).

In exemplary embodiments, the pad connection region DLX may vertically overlap two pad layers 170 successively disposed in the first horizontal direction (the X direction). The pad connection region DLX may vertically overlap two pad layers 170 successively disposed in the second horizontal direction (the Y direction). For example, the pad connection region DLX may vertically overlap the first and third pad layers 170_1 and 170_5 successively disposed in the first horizontal direction (the X direction), and may vertically overlap the third and fourth pad layers 170_5 and 170_6 successively disposed in the second horizontal direction (the Y direction).

As illustrated in the plan view of FIG. 8, the pad contact 184 may be disposed in a center region of each pad layer 170, and a plurality of dummy channel structures D150 may be arranged at certain intervals in an edge of each pad layer 170. In the plan view, a whole sidewall of each of the plurality of dummy channel structures D150 may be surrounded by a corresponding pad layer 170. In exemplary embodiments, unlike the illustrations of FIGS. 8 and 9, at least one of the plurality of dummy channel structures D150 may be disposed to vertically overlap an edge 170E1 of a corresponding pad layer 170 extending in the second horizontal direction (the Y direction).

As seen from above, a sidewall of the first dummy line DL1 may be surrounded by the third and fourth pad layers 170_5 and 170_6, and a sidewall of the second dummy line DL2 may be surrounded by the first and second pad layers 170_1 and 170_2. Upper surfaces of the first and second pad layers 170_1 and 170_2 vertically overlapping the second pad connection region DLX2 may be disposed on a level which is lower in position than upper surfaces of the third and fourth pad layers 170_5 and 170_6 vertically overlapping the first pad connection region DLX1. For example, upper surfaces of the first and second pad layers 170_1 and 170_2 overlapping the second pad connection region DLX2 in the second horizontal direction (the Y direction) may be disposed lower in position, in the Z direction, than upper surfaces of the third and fourth pad layers 170_5 and 170_6 overlapping the first pad connection region DLX1 in the second horizontal direction (the Y direction) (see FIG. 9). The edge 170E1 of the third and fourth pad layers 170_5 and 170_6 may be disposed between the first dummy line DL1 and the second dummy line DL2.

In exemplary embodiments, in a plan view, the first to fourth pad layers 170_1, 170_2, 170_5, and 170_6 vertically overlapping the pad connection region DLX may be arranged in an I form (or a 90-degree-rotated H form). For example, in exemplary embodiments, the first to fourth pad layers 170_1, 170_2, 170_5, and 170_6 that overlap the corresponding pad connection region DLX may have an I-shape in a plan view. For example, a first width WY1, based on one sidewall (for example, a second horizontal direction (a Y direction) of the edge 170E1) extending in the second horizontal direction (the Y direction), of each pad layer 170 may be greater than a second width WY2, based on a second horizontal direction (a Y direction) of another sidewall extending in the second horizontal direction (the Y direction), of a corresponding pad layer 170. The fourth pad layer 170_6 surrounding a sidewall of the first dummy line DL1 and the second pad layer 170_2 surrounding a sidewall of the second dummy line DL2 may have a symmetrical shape with respect to the edge 170E1 corresponding to a center line therebetween.

As illustrated in FIG. 8, a first length D11 of the first pad connection region DLX1 in the first horizontal direction (the X direction) may be less than about ½ of a third width WX1 of a corresponding pad layer 170 in the first horizontal direction (the X direction). For example, a portion of the dummy line opening DLH overlapping the corresponding pad layer 170 in the first horizontal direction (the X direction) may have a second length D12 in the first horizontal direction (the X direction), and the second length D12 may be greater than about ½ of the third width WX1 of the corresponding pad layer 170 in the first horizontal direction (the X direction). The dummy line opening DLH may extend by the second length D12, which is greater than about ½ of the third width WX1 of the corresponding pad layer 170, and a process error may be reduced in a process of forming each pad layer 170 through the dummy line opening DLH. For example, in exemplary embodiments, the length of a dummy line opening DLH overlapping a corresponding pad layer 170 in the first horizontal direction (the X direction) may be grater than about ½ of the width of the corresponding pad layer 170 in the first horizontal direction (the X direction).

The terms "about" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

One sidewall of each pad layer 170 extending in the first horizontal direction (the X direction) may face a corresponding common source line 140 provided in a corresponding word line cut region WLC. Another sidewall of each pad layer 170 extending in the first horizontal direction may face a corresponding dummy line DL provided in the corresponding word line cut region WLC. The corresponding common source line 140, the corresponding dummy line DL, and a corresponding pad contact 184 may be disposed on the same line in the second horizontal direction (the Y direction). For example, the corresponding pad contact 184 and the corresponding dummy line DL may be disposed at positions overlapping each other in the second horizontal direction (the Y direction).

An edge DL1E of the first dummy line DL1 (for example, one sidewall of the first dummy line DL1 extending in the second horizontal direction (the Y direction)) may protrude toward a pad contact 184 adjacent to the second dummy line DL2 (for example, a pad contact 184 disposed on the second pad layer 170_2) with respect to a center 184C1 of a pad contact 184 disposed adjacent to the first dummy line DL1 (for example, a pad contact 184 disposed on the fourth pad layer 170_6). Further, an edge DL2E of the second dummy line DL2 may protrude toward a pad contact 184 adjacent to the first dummy line DL1 relative to a center 184C2 of a pad contact 184 disposed adjacent to the second dummy line DL2 (for example, a center 184C2 of a pad contact 184 disposed on the second pad layer 170_2).

For example, in exemplary embodiments, the edge DL1E of the first dummy line DL1 may extend beyond the center 184C1 of the pad contact 184C disposed adjacent to the first dummy line DL1 (for example, a pad contact 184C disposed on the fourth pad layer 170_6), and may be disposed between the center 184C1 of the pad contact 184C disposed adjacent to the first dummy line DL1 and the pad contact 184C disposed adjacent to the second dummy line DL2 (for example, a pad contact 184C disposed on the second pad layer 170_2) in a plan view. Further, the edge DL2E of the second dummy line DL2 may extend beyond the center 184C2 of the pad contact 184C disposed adjacent to the second dummy line DL2 (for example, a pad contact 184C disposed on the second pad layer 170_2), and may be disposed between the center 184C2 of the pad contact 184C disposed adjacent to the second dummy line DL2 and the pad contact 184C disposed adjacent to the first dummy line DL1 (for example, a pad contact 184C disposed on the fourth pad layer 170_6) in a plan view.

The edge DL1E of the first dummy line DL1 may protrude toward an edge 170E1 of a corresponding pad layer 170 with respect to the center 184C1 of the pad contact 184 adjacent to the first dummy line DL1. For example, the edge DL1E of the first dummy line DL1 may be closer to the edge 170E1 of the corresponding pad layer 170 (for example, an edge 170E1 of the fourth pad layer 170_6) than the center 184C1 of the pad contact 184 adjacent to the first dummy line DL1 (for example, the pad contact 184 disposed on the fourth pad layer 170_6) is. For example, as illustrated in FIG. 8, a second distance D32 between the edge DL1E of the first dummy line DL1 and the edge 170E1 of the fourth pad layer 170_6 may be less than a first distance D31 between the edge 170E1 of the fourth pad layer 170_6 and the center 184C1 of the pad contact 184 adjacent to the first dummy line DL1 (e.g., D31>D32). In exemplary embodiments, the edge DL1E of the first dummy line DL1 may be closer to the edge 170E1 of the corresponding pad layer 170 (for example, an edge 170E1 of the fourth pad layer 170_6) than the pad contact 184 adjacent to the first dummy line DL1 (for example, the pad contact 184C disposed on the fourth pad layer 170_6) is.

Moreover, the edge DL2E of the second dummy line DL2 may protrude toward an edge 170E1 of a corresponding pad layer 170 (or toward the first dummy line DL1) with respect to the center 184C2 of the pad contact 184 adjacent to the second dummy line DL2. For example, the edge DL2E of the second dummy line DL2 may be closer to the edge 170E1 of the corresponding pad layer 170 (for example, the edge 170E1 of the fourth pad layer 170_6) than the center 184C2 of the pad contact 184 adjacent to the second dummy line DL2 (for example, the pad contact 184 disposed on the second pad layer 170_2) is. For example, as illustrated in FIG. 8, a fourth distance D34 between the edge DL2E of the second dummy line DL2 and the edge 170E1 of the fourth pad layer 170_6 may be less than a third distance D33 between the edge 170E1 of the fourth pad layer 170_6 and the center 184C2 of the pad contact 184 adjacent to the second dummy line DL2 (i.e., D33>D34). In exemplary embodiment, the edge DL2E of the second dummy line DL2 may be closer to the edge 170E1 of the corresponding pad layer 170 (for example, the edge 170E1 of the fourth pad layer 170_6) than the pad contact 184 adjacent to the second dummy line DL2 (for example, the pad contact 184 disposed on the second pad layer 170_2) is.

The edge DL1E of the first dummy line DL1 may overlap the pad contact 184 adjacent to the first dummy line DL1 or the center 184C1 of the pad contact 184 in the second horizontal direction (the Y direction), and the edge DL2E of the second dummy line DL2 may overlap the pad contact 184 adjacent to the second dummy line DL2 or the center 184C2 of the pad contact 184 in the second horizontal direction (the Y direction).

In FIG. 8, a shortest path D21 passing through a center 184C of a pad contact 184 from a word line cut region WLC and a dummy line cut region DLC is illustrated as a dashed-line arrow. A distance of the shortest path D21 from the word line cut region WLC, passing through the center 184C of the pad contact 184, to the dummy line cut region DLC may be less than a first width WY1 of a pad layer 170. In exemplary embodiments, the shortest path D21 does not overlap the plurality of dummy channel structures D150. For example, in exemplary embodiments, the plurality of dummy channel structures D150 is not disposed in the shortest path D21 between the dummy line cut region DLC and the pad contact 184. In a process of forming the pad layer 170, an etchant for removing a sacrificial layer 210 or a metal material included in the pad layer 170 may be supplied along the shortest path D21. The shortest path D21 from the word line cut region WLC, passing through the center 184C of the pad contact 184, to the dummy line cut region DLC may be relatively short, and moreover, may not be hindered by the plurality of dummy channel structures D150. Therefore, a metal material may be filled into a whole area of the pad layer 170 without a void. For example, exemplary embodiments may prevent a void from being formed in a portion of the pad layer 170 adjacent to the center 184C of the pad contact 184.

Generally, to form the pad layer 170, the sacrificial layer 210 (see FIGS. 16A and 16B) may be removed by supplying an etchant through the word line cut region WLC, and by filling a metal material into a space from which the sacrificial layer 210 is removed, the pad layer 170 may be formed. However, in a comparative example, since a distance between the word line cut region WLC and the pad layer 170 is relatively long, the sacrificial layer 210 may not be sufficiently removed or the metal material may not be fully filled into the space from which the sacrificial layer 210 is removed. Further, when the plurality of dummy channel structures D150 is disposed adjacent to a path through which the metal material is supplied, the metal material may be needed to move around or bypass a sidewall of each of the plurality of dummy channel structures D150. As a result, the path through which the metal material is supplied may become longer. Therefore, in a comparative example, a portion of the pad layer 170 vertically overlapping the pad contact 184 may not be fully filled with the metal material, and as a result, a void may occur. In this case, a defect may occur in an etching process of forming the pad contact 184 connected to the pad layer 170.

According to the above-described semiconductor device 100, in exemplary embodiments, since a plurality of dummy line cut regions DLC extending in the first horizontal direction are provided between adjacent word line cut regions WLC, and since each of the dummy line cut regions DLC is disposed close to an edge 170E1 of a pad layer 170, a supply path of an etchant for removing the sacrificial layer 210 and/or a supply path of the metal material included in the pad layer 170 may be relatively shortened with respect to a whole area of the pad layer 170. Therefore, the metal material may be filled into the pad layer 170 without a void. As a result, a defect, which may occur in an etching process of forming a pad contact 184 connected to the pad layer 170, may be prevented, or occurrence of the defect may be reduced.

Moreover, since a pad connection region DLX is disposed between a plurality of dummy line cut regions DLC, portions of gate electrodes 120 overlapping the pad connection region DLX may be connected to each other without being separated therefrom. As a result, the gate electrodes 120 provided in a connection region CON may be prevented from being bent or from leaning by stress caused by a high temperature applied thereto in a manufacturing process.

FIGS. 10A to 10D are cross-sectional views illustrating various configurations of a gate insulation layer 152 included in a semiconductor device 100 according to exemplary embodiments.

Figure 10A:
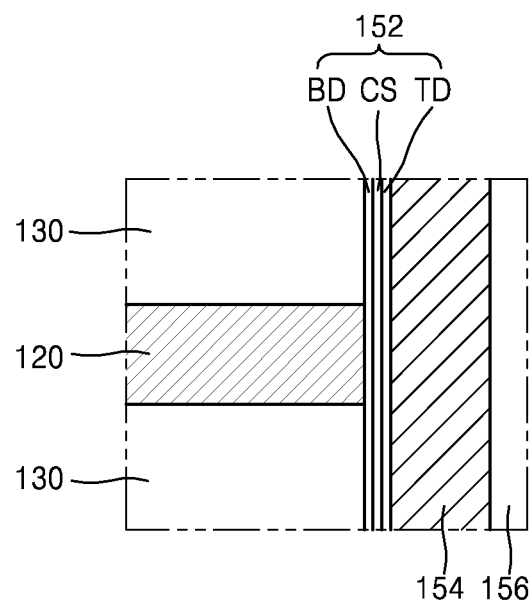
FIGS. 10A to 10D are cross-sectional views illustrating various configurations of a gate insulation layer included in a semiconductor device according to exemplary embodiments.

FIG. 10A is an enlarged cross-sectional view of region CX1 illustrated in FIG. 4.

Referring to FIG. 10A, the gate insulation layer 152 may have a structure including a tunneling dielectric layer TD, a charge storage layer CS, and a blocking dielectric layer BD which are sequentially disposed adjacent to a channel layer 154. A relative thickness of each of the tunneling dielectric layer TD, the charge storage layer CS, and the blocking dielectric layer BD is not limited to the illustration of FIG. 10A, and may be variously modified.

The tunneling dielectric layer TD may include, for example, silicon oxide, hafnium oxide, aluminum nitride, zirconium oxide, tantalum oxide, or the like. The charge storage layer CS may be a region which stores electric charges passing through the tunneling dielectric layer TD from the channel layer 154 and may include, for example, silicon nitride, boron nitride, silicon boron nitride, impurity-doped polysilicon, or the like. The blocking dielectric layer BD may include, for example, silicon oxide, silicon nitride, silicon oxynitride, or a metal oxide of which the dielectric constant is higher than that of silicon oxide. The metal oxide may include, for example, hafnium oxide, aluminum nitride, zirconium oxide, tantalum oxide, or a combination thereof.

Figure 10B:
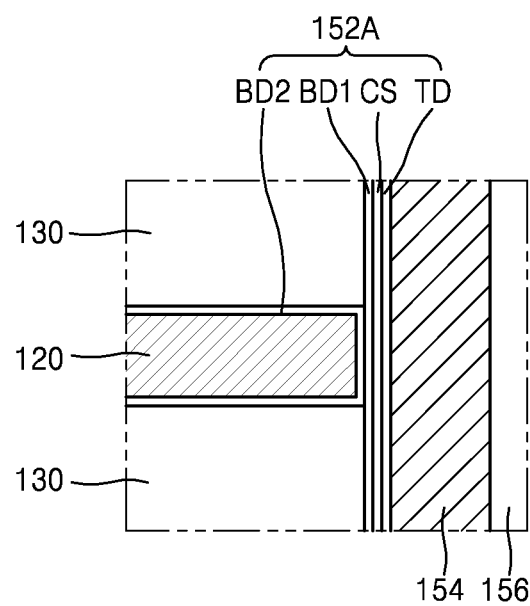
Figure 10C:
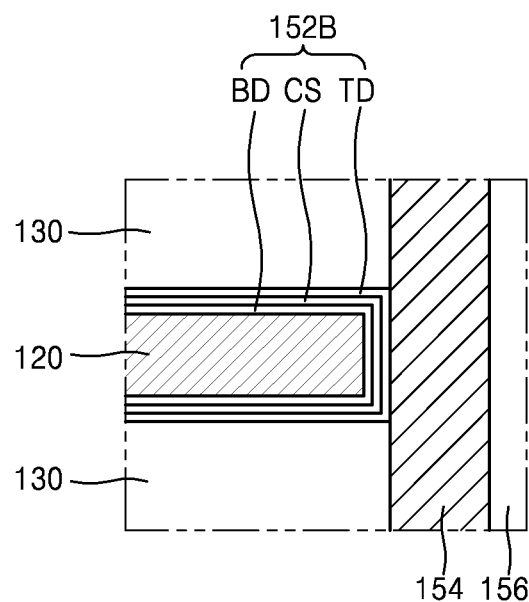
Figure 10D:
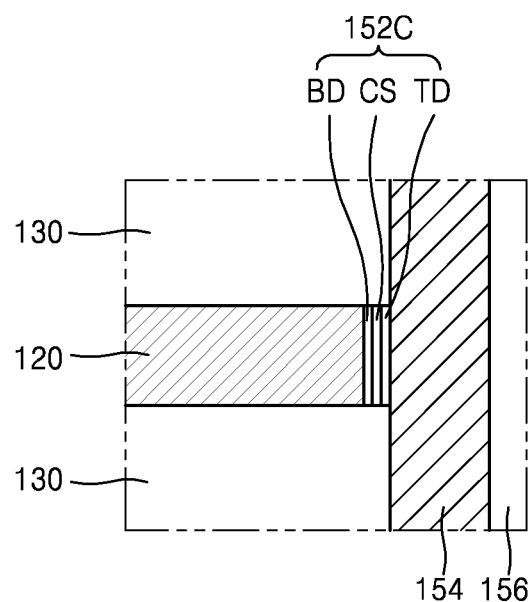

FIGS. 10B to 10D are cross-sectional views illustrating exemplary structures of gate insulation layers 152A to 152C capable of being applied to the gate insulation layer 152 illustrated in FIG. 10A.

In exemplary embodiments, the semiconductor device 100 may include the gate insulation layer 152A illustrated in FIG. 10B instead of the gate insulation layer 152 illustrated in FIG. 10A. The gate insulation layer 152A may include a configuration which is substantially the same as that of the gate insulation layer 152 illustrated in FIG. 10A. However, the gate insulation layer 152A may include a first blocking dielectric layer BD1 and a second blocking dielectric layer BD2 instead of the blocking dielectric layer BD. The first blocking dielectric layer BD1 may extend in parallel with a channel layer 154 along with the tunneling dielectric layer TD and the charge storage layer CS, and the second blocking dielectric layer BD2 may surround a gate electrode 120. For example, the first blocking dielectric layer BD1 may extend in parallel with the channel layer 154 in a first direction, and the second blocking dielectric layer BD2 may include a first portion that extends in parallel with the channel layer 154 in the first direction, and second portions branching from the first portion and extending in parallel with sides of the gate electrode 120 in a second direction perpendicular to the first direction. The first blocking dielectric layer BD1 and the second blocking dielectric layer BD2 may each include, for example, silicon oxide, silicon nitride, a metal oxide, or the like. For example, the first blocking dielectric layer BD1 may include silicon oxide, and the second blocking dielectric layer BD2 may include a metal oxide of which the dielectric constant is higher than that of silicon oxide.

In exemplary embodiments, the semiconductor device 100 may include the gate insulation layer 152B illustrated in FIG. 10C instead of the gate insulation layer 152 illustrated in FIG. 10A. The gate insulation layer 152B may include a surface of a gate electrode 120 facing a channel layer 154 and surfaces of the gate electrode 120 facing an insulation layer 130, and may cover a lower surface, an upper surface, and a sidewall of the gate electrode 120. The gate insulation layer 152B may include a tunneling dielectric layer TD, a charge storage layer CS, and a blocking dielectric layer BD which are sequentially disposed adjacent to the channel layer 154.

In exemplary embodiments, the semiconductor device 100 may include the gate insulation layer 152C illustrated in FIG. 10D instead of the gate insulation layer 152 illustrated in FIG. 10A. The gate insulation layer 152C may be provided between a gate electrode 120 and a channel layer 154 to cover only a sidewall of the gate electrode 120 without covering a lower surface and an upper surface of the gate electrode 120. The gate insulation layer 152C may include a tunneling dielectric layer TD, a charge storage layer CS, and a blocking dielectric layer BD which are sequentially disposed adjacent to the channel layer 154.

A configuration and a shape of a gate dielectric layer capable of being included in the semiconductor device 100 according to exemplary embodiments are not limited to those of the gate insulation layers 152 and 152A to 152C respectively illustrated in FIGS. 10A to 10D, and may be variously modified within the scope of the inventive concept. In exemplary embodiments, each of the gate insulation layers 152 and 152A to 152C may include a material (for example, a phase change material) having an electrical resistance which varies based on heat generated by a current passing through an electrode adjacent thereto. The phase change material may further include, for example, at least one impurity selected from among nitrogen (N), oxygen (O), carbon (C), bismuth (Bi), indium (In), boron (B), tin (Sn), silicon (Si), titanium (Ti), aluminum (Al), nickel (Ni), iron (Fe), dysprosium (Dy), and lanthanum (La). For example, each of the gate insulation layers 152 and 152A to 152C may include GeBiTe, InSb, GeSb, or GaSb. In exemplary embodiments, each of the gate insulation layers 152 and 152A to 152C may have a thin film structure having an electrical resistance which varies by using a spin transfer process based on a current. For example, each of the gate insulation layers 152 and 152A to 152C may include a ferromagnetic material or an antiferromagnetic material. In exemplary embodiments, each of the gate insulation layers 152 and 152A to 152C may include a Perovskite compound or transition metal oxide. For example, each of the gate insulation layers 152 and 152A to 152C may include niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, barium-strontium-zirconium oxide, or the like.

Figure 12:
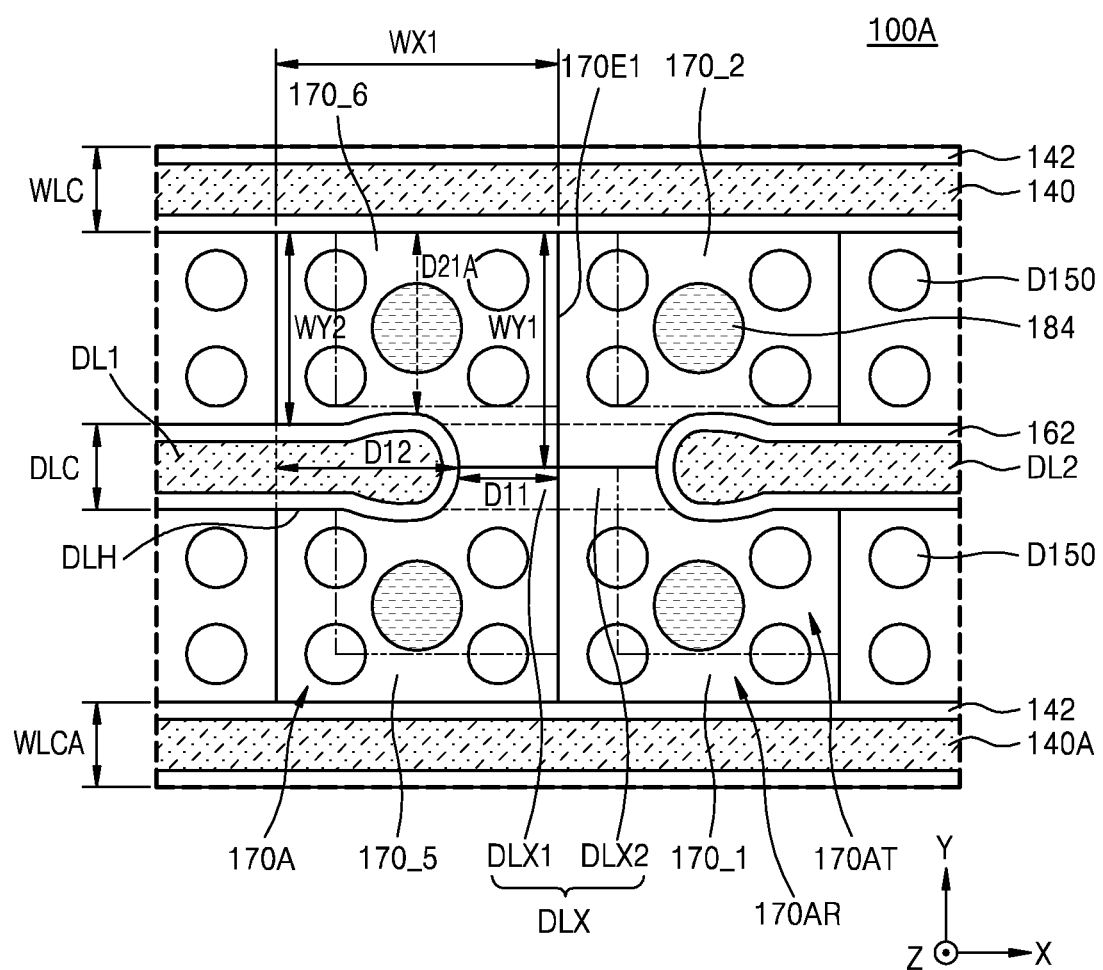
FIG. 12 is a plan view of the semiconductor device illustrated in FIG. 11.

FIG. 11 is a cross-sectional view illustrating a semiconductor device 100A according to exemplary embodiments. FIG. 12 is a plan view of the semiconductor device 100A illustrated in FIG. 11. More particularly, FIG. 11 is a cross-sectional view corresponding to a cross-sectional surface taken along line B4-B4' of FIG. 2, and FIG. 12 is a plan view of a portion corresponding to region A2 of FIG. 2.

Referring to FIGS. 11 and 12, a pad layer 170A may include a raised portion 170AT and a flat portion 170AR. An upper surface of the raised portion 170AT may be disposed on a level which is higher in position than an upper surface of a gate electrode 120 extending to the pad layer 170A. An upper surface of the flat portion 170AR may be disposed on the same level as the upper surface of the gate electrode 120. The raised portion 170AT of the pad layer 170A may have a vertical-direction (Z-direction) thickness which is greater than a vertical-direction (Z-direction) thickness of the gate electrode 120. A pad contact 184 may be disposed on the raised portion 170AT of the pad layer 170A. For example, in a process of forming a pad contact hole 184H (see FIG. 19B) by etching an interlayer insulation layer 176 so as to form the pad contact 184, an upper surface of the raised portion 170AT may be exposed at a bottom of the pad contact hole 184H. The raised portion 170AT may have a relatively thick vertical-direction (Z-direction) thickness, and thus, a degree of difficulty in an etching process may be reduced in a process of forming the pad contact hole 184H.

Each of a plurality of dummy lines DL may have a shape in which an end thereof disposed in a first horizontal direction (an X direction) is rounded. For example, since each of the plurality of dummy lines DL has a shape in which the end thereof is rounded, a shortest path D21A from a word line cut region WLC passing through a center of the pad contact 184 to a dummy line cut region DLC may be relatively short.

In a process of forming the pad layer 170A, an etchant for removing a sacrificial layer 210 or a metal material included in the pad layer 170A may be supplied along the shortest path D21A. The shortest path D21A from the word line cut region WLC and the dummy line cut region DLC to a center of the pad contact 184 may be relatively short. Therefore, a metal material may be filled into a whole area of the pad layer 170A without a void. For example, according to exemplary embodiments, a void may be prevented from being formed in a portion of the pad layer 170A adjacent to the center of the pad contact 184.

Since the raised portion 170AT of the pad layer 170A has a relatively thick vertical thickness, it may be difficult to fill the metal material into the raised portion 170AT without a void in a comparative example. According to a semiconductor device of a comparative example, the dummy line cut region DLC may not be provided, and the pad layer 170A is formed by supplying a metal material through the word line cut region WLC and a middle word line cut region WLCA. For example, when the flat portion 170AR, having a relatively thin vertical thickness, of the pad layer 170A is disposed close to the word line cut region WLC or the middle word line cut region WLCA, the metal material is supplied to the inside of the raised portion 170AT through the flat portion 170AR. However, since the flat portion 170AR has a relatively thin vertical thickness, the metal material may be first filled into the flat portion 170AR, and in this case, a path through which the metal material is supplied to the raised portion 170AT may be blocked. As a result, the metal material is not fully filled into the raised portion 170AT, and a void may be formed in the raised portion 170AT in the comparative example. In this case, in an etching process of forming the pad contact 184, an etching process defect may occur due to the void occurring in the raised portion 170AT.

However, according to the above-described semiconductor device 100A according to exemplary embodiments, the metal material may be supplied through the dummy line cut region DLC, the word line cut region WLC, and the middle word line cut region WLCA, and thus, may be fully filled into the pad layer 170A without a void. For example, as illustrated in FIG. 11, the raised portion 170AT may be disposed to contact at least one of the dummy line cut region DLC, the word line cut region WLC, and the middle word line cut region WLCA. In addition, the dummy line cut region DLC may be disposed close to an edge 170E1 of the pad layer 170A, and thus, a supply path of the etchant for removing the sacrificial layer 210 and/or a supply path of the metal material included in the pad layer 170A may be relatively shortened with respect to a whole area of the pad layer 170A. Therefore, the metal material may be filled into the pad layer 170A (for example, into the raised portion 170AT) without a void. As a result, a defect, which may occur in a process of forming the pad contact 184 connected to the pad layer 170A, may be avoided.

Moreover, a pad connection region DLX may be disposed between a plurality of dummy line cut regions DLC, and portions of the gate electrodes 120 overlapping the pad connection region DLX may be connected to each other without being separated therefrom. As a result, the gate electrodes 120 provided in a connection region CON may be prevented from being bent or from leaning by stress caused by a high temperature applied thereto in a manufacturing process.

FIG. 13 is a plan view illustrating a semiconductor device 100B according to exemplary embodiments. In FIG. 13, like reference numerals illustrated in FIGS. 1 to 12 refer to like elements. Further, in FIG. 13, for convenience of illustration, only some elements of the semiconductor device 100B are schematically illustrated.

Referring to FIG. 13, in a connection region CON, a plurality of dummy lines DLA may extend by a first length LA1. For example, a long side (or a sidewall extending a first horizontal direction (an X direction)) of each of the plurality of dummy lines DLA may be surrounded by four pad layers 170 successively disposed in the first horizontal direction (the X direction). However, a length of each of the plurality of dummy lines DLA is not limited thereto.

In a dummy cell region DM, one pad layer 170 may surround all sidewalls of two middle common source lines 140A which are spaced apart from each other in the first horizontal direction (the X direction). Therefore, the first portion 120S1 (see FIG. 2) and the second portion 120S2 (see FIG. 2) of the gate electrode 120 (see FIG. 3) may be connected to each other in one pad layer 170 in the dummy cell region DM and may be disposed apart from each other in a whole area of the connection region CON.

Figure 14:
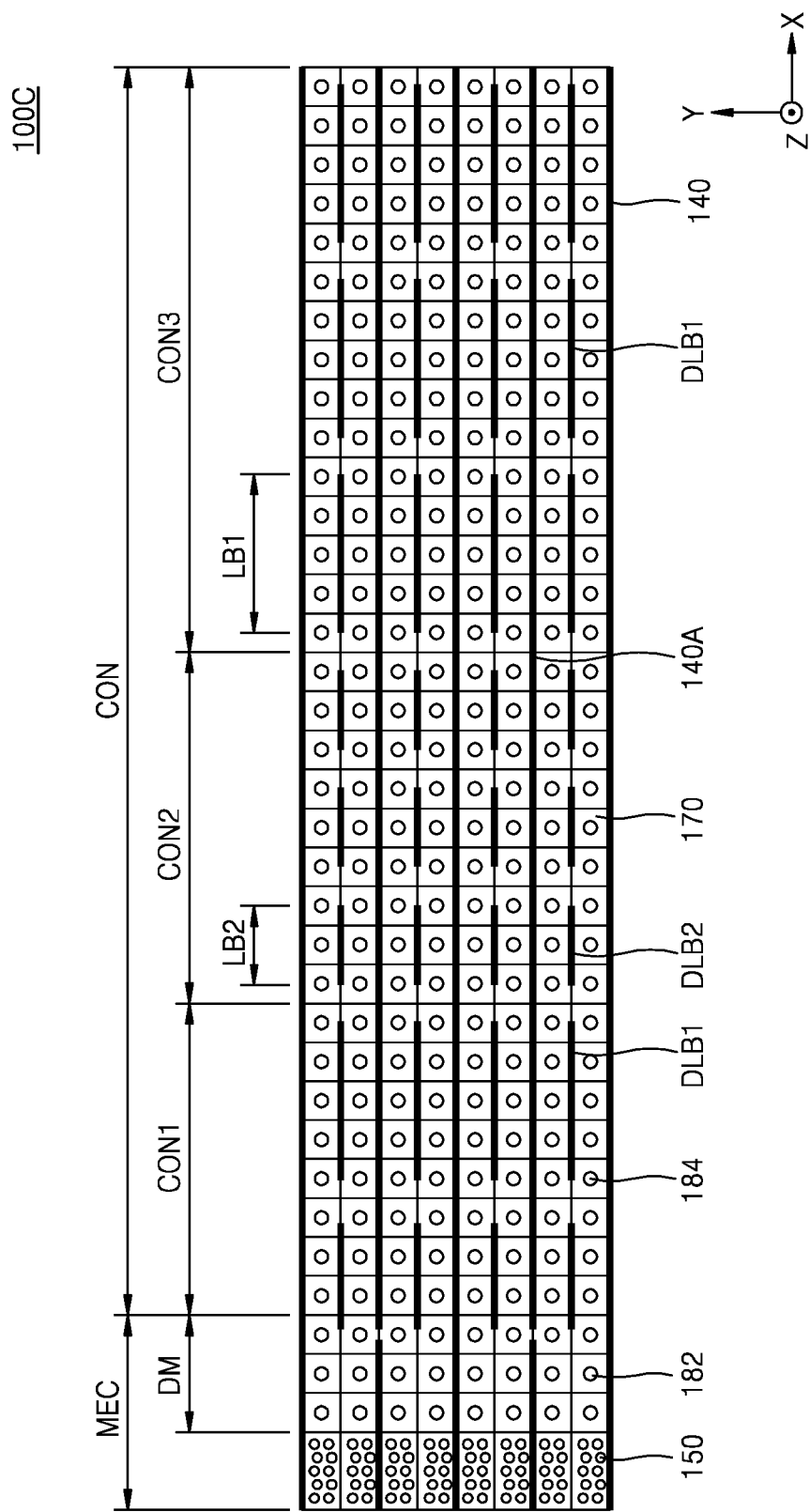
FIG. 14 is a plan view illustrating a semiconductor device according to exemplary embodiments.

FIG. 14 is a plan view illustrating a semiconductor device 100C according to exemplary embodiments. In FIG. 14, like reference numerals illustrated in FIGS. 1 to 13 refer to like elements. In FIG. 14, for convenience of illustration, only some elements of the semiconductor device 100C are schematically illustrated.

Referring to FIG. 14, a connection region CON may include a first connection region CON1, a second connection region CON2, and a third connection region CON3 which are sequentially provided in a direction farther away from a dummy cell region DM. A plurality of first dummy lines DLB1 may be disposed in the first connection region CON1 and the third connection region CON3, and a plurality of second dummy lines DLB2 having a second length LB2 which is less than a first length LB1 of each of the plurality of first dummy lines DLB1 in a first horizontal direction (an X direction) may be disposed in the second connection region CON2.

In exemplary embodiments, the second connection region CON2 may be disposed to have a length within a distance between a position corresponding to about 25% of a total length of the connection region CON and a position corresponding to about 60% of the total length of the connection region CON with respect to a start point of the connection region CON (for example, with respect to a boundary between the dummy cell region DM and the connection region CON). For example, the second connection region CON2 may be disposed within a distance between a position corresponding to about 33% of the total length of the connection region CON and a position corresponding to about 50% of the total length of the connection region CON with respect to the start point of the connection region CON.

Thus, in exemplary embodiments, the plurality of second dummy lines DLB2 may be arranged between a position corresponding to about 25% of a total length of the connection region CON in the first horizontal direction (the X direction), and a position corresponding to about 60% of the total length of the connection region CON with respect to a boundary between the memory cell region MEC and the connection region CON.

In the second connection region CON2, a long side (or a sidewall extending in the first horizontal direction (the X direction)) of each of the plurality of second dummy lines DLB2 may be surrounded by three pad layers 170 successively disposed in the first horizontal direction (the X direction). In the first and third connection regions CON1 and CON3, a long side (or a sidewall extending in the first horizontal direction (the X direction)) of each of the plurality of first dummy lines DLB1 may be surrounded by five pad layers 170 successively disposed in the first horizontal direction (the X direction). However, a length of each of the plurality of first dummy lines DLB1 and a length of each of the plurality of second dummy lines DLB2 are not limited thereto. Further, in exemplary embodiments, unlike the illustration of FIG. 14, a length of a first dummy line DLB1 in the first connection region CON1 may differ from that of a first dummy line DLB1 in the third connection region CON3.

In the connection region CON, a height of the gate electrode 120 (see FIG. 3) may be progressively reduced in a direction farther away from a memory cell region MEC. Since a height of the gate electrode 120 is reduced based on a position in the connection region CON, a larger stress may be applied to the gate electrode 120 in a local portion of the connection region CON. For example, in comparison with the first and third connection regions CON1 and CON3, a larger stress may be applied to the gate electrode 120 in the second connection region CON2. In this case, in the second connection region CON2, the second dummy lines DLB2 may be provided to have a relatively short length, and a density of a pad connection region DLX (see FIG. 8) may increase more, thereby further enhancing a supporting function of the pad connection region DLX. Accordingly, the gate electrodes 120 provided in a connection region CON may be prevented from being bent or from leaning by stress caused by a high temperature applied thereto in a manufacturing process.

FIGS. 15A, 15B, 16A, 16B, 17A, 17B, 18A, 18B, 19A, and 19B are cross-sectional views illustrating a method of manufacturing a semiconductor device 100 in a process sequence, according to exemplary embodiments. FIGS. 15A, 16A, 17A, 18A, and 19A are cross-sectional views corresponding to a cross-sectional surface taken along line B1-B1' of FIG. 2. FIGS. 15B, 16B, 17B, 18B, and 19B are cross-sectional views corresponding to a cross-sectional surface taken along line B4-B4' of FIG. 2. In FIGS. 15A to 19B, like reference numerals illustrated in FIGS. 1 to 14 refer to like elements.

Figure 15B:
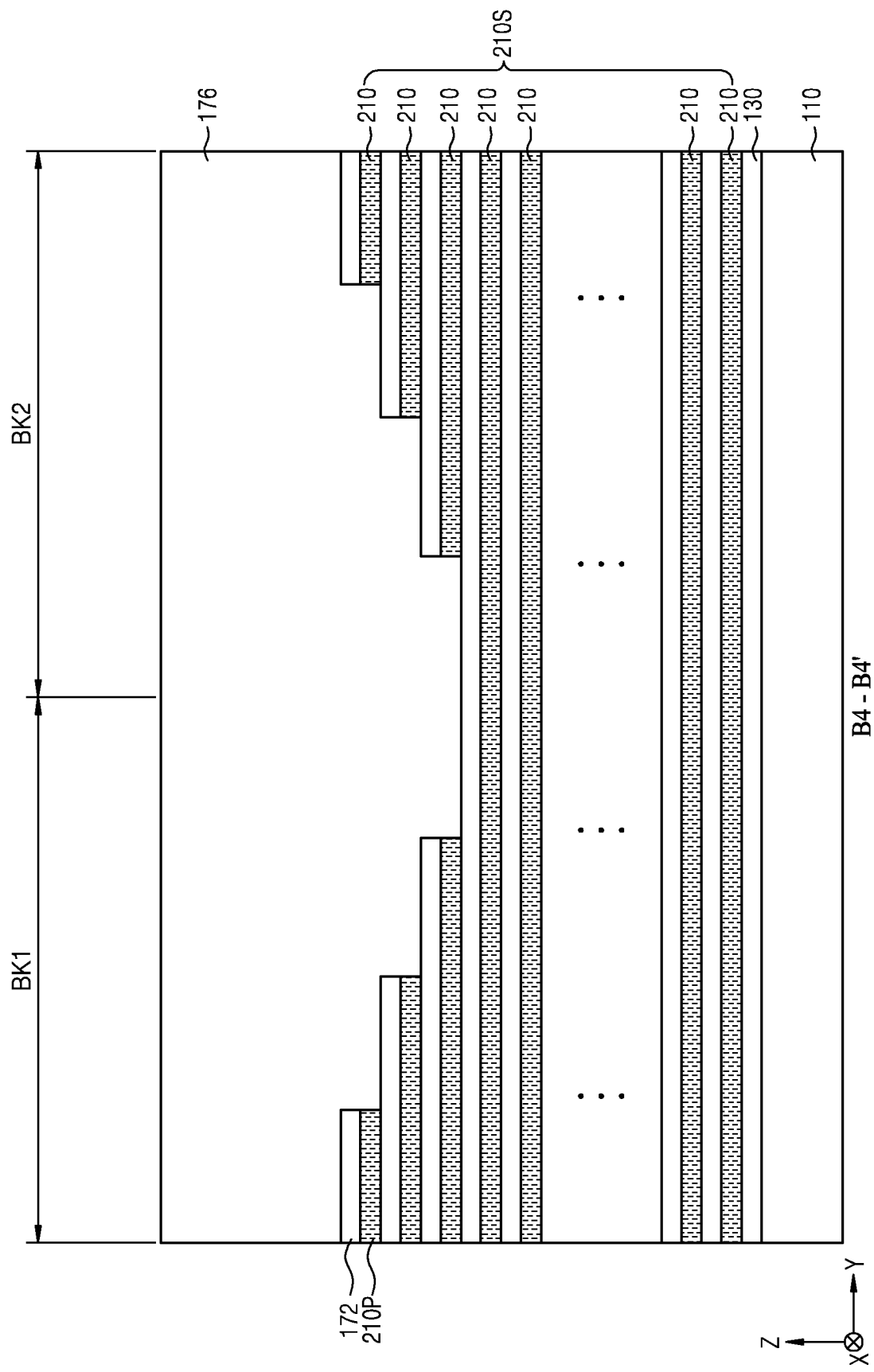

Referring to FIGS. 15A and 15B, a mold stack 210S may be formed on a main surface 110M of a substrate 110 in a memory cell region MEC and a connection region CON of the substrate 110. The mold stack 210S may include a plurality of insulation layers 130 and a plurality of sacrificial layers 210, which are alternately disposed. In exemplary embodiments, the plurality of insulation layers 130 may each include an insulating material such as silicon oxide or silicon oxynitride, and the plurality of sacrificial layers 210 may each include silicon oxide, silicon oxynitride, impurity-doped polysilicon, or the like.

Subsequently, in the connection region CON, a plurality of pad forming parts 210P may be formed by sequentially patterning the mold stack 210S. In such a process, the insulation layers 130 respectively provided on the plurality of pad forming parts 210P may be patterned, and thus, a plurality of pad insulation layers 172 respectively covering the plurality of pad forming parts 210P may be formed.

In exemplary embodiments, the plurality of pad forming parts 210P may be formed in a stepped form having a difference between upper surface levels thereof in a first horizontal direction (an X direction) and a second horizontal direction (a Y direction). For example, four pad forming parts 210P which are sequentially stacked may have the same length in the first horizontal direction (the X direction), and upper surfaces of the four pad forming parts 210P may be disposed in a stepped form in the second horizontal direction (the Y direction).

Subsequently, an interlayer insulation layer 176 covering the mold stack 210S may be formed. The interlayer insulation layer 176 may include an insulating material such as silicon oxide or silicon oxynitride.

In regard to a resultant material formed in FIGS. 15A and 15B, the plurality of pad insulation layers 172 respectively covering the plurality of pad forming parts 210P may be removed, and a pad sacrificial layer may be further formed on the plurality of pad forming parts 210P. The pad sacrificial layer may be formed on a portion of an upper surface of each of the plurality of pad forming parts 210P. The plurality of pad forming parts 210P and the pad sacrificial layer disposed thereon may each function as a sacrificial layer for forming a raised portion 170AT of a pad layer 170A. In a subsequent process, the plurality of pad forming parts 210P and the pad sacrificial layer disposed thereon may be removed, and by filling a metal material into a space formed through the removal, the pad layer 170A including the raised portion 170AT may be formed. In this case, the semiconductor device 100A described above with reference to FIGS. 11 and 12 may be formed.

Referring to FIGS. 16A and 16B, in the memory cell region MEC and the connection region CON, a channel hole 150H and a dummy channel hole D150H (see FIG. 6) may be formed in the mold stack 210S. A gate insulation layer 152, a channel layer 154, and a buried insulation layer 156 may be sequentially formed on an inner wall of each of the channel hole 150H and the dummy channel hole D150H. Subsequently, a portion of an upper portion of each of the channel hole 150H and the dummy channel hole D150H may be removed through an etchback process, and a conductive plug 158 which plugs an inlet of each of the channel hole 150H and the dummy channel hole D150H may be formed. Therefore, a channel structure 150 and a dummy channel structure D150 (see FIG. 6) may be respectively formed in the channel hole 150H and the dummy channel hole D150H.

Figure 17A:
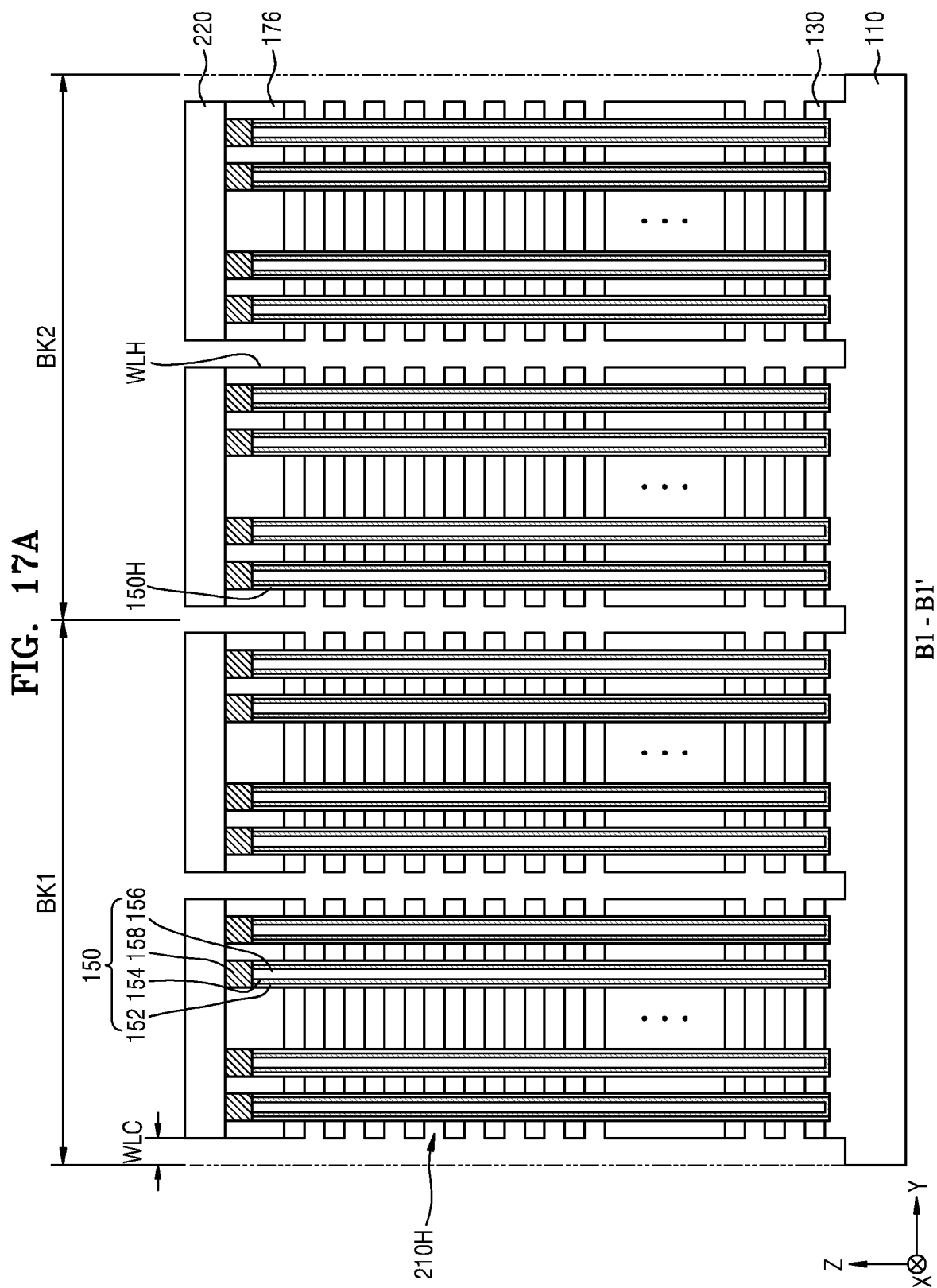
Figure 17B:
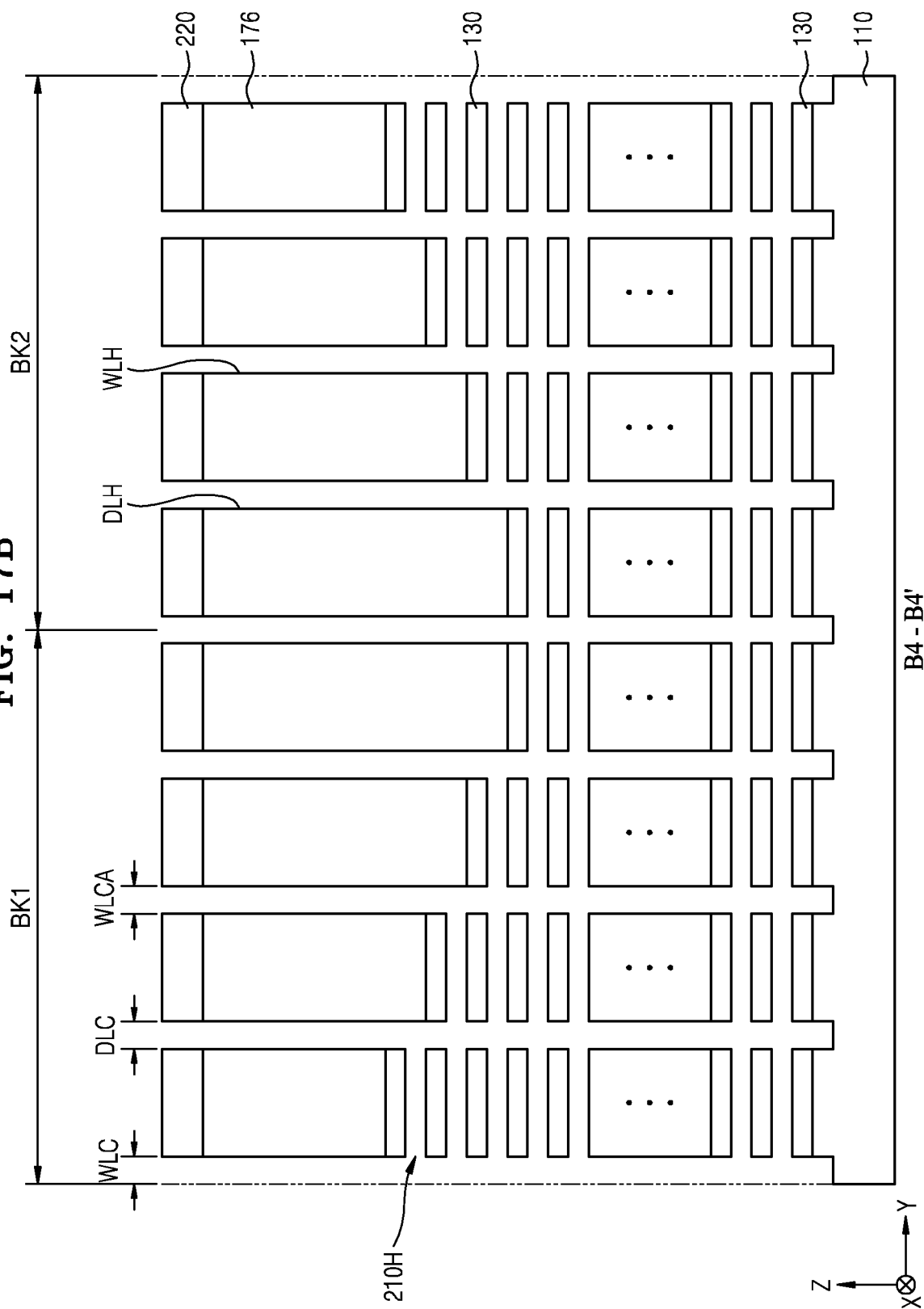

Referring to FIGS. 16A and 16B, an upper insulation layer 220 may be formed on the mold stack 210S (see FIG. 17A). A mask pattern may be formed on the upper insulation layer 220, and by removing a portion of each of the upper insulation layer 220 and the mold stack 210S by using the mask pattern as an etch mask, a word line opening WLH may be formed in a word line cut region WLC and a middle word line cut region WLCA and a dummy line opening DLH may be formed in a dummy line cut region DLC. An upper surface of the substrate 110 may be exposed at a bottom of each of the word line opening WLH and the dummy line opening DLH.

Subsequently, by removing a sacrificial layer 210 (see FIG. 17A) exposed through the word line opening WLH and the dummy line opening DLH, a mold opening 210H may be formed in a portion from which each of the sacrificial layers 210 is removed. Sidewalls of a plurality of channel structures 150 and sidewalls of a plurality of dummy channel structures D150 may be exposed by the mold opening 210H.

In exemplary embodiments, a process of removing the sacrificial layers 210 may be a wet etching process using a phosphate solution as an etchant. In the process of removing the sacrificial layers 210, an inflow path of the etchant for removing the sacrificial layers 210 may be shortened by the dummy line opening DLH.

Figure 18A:
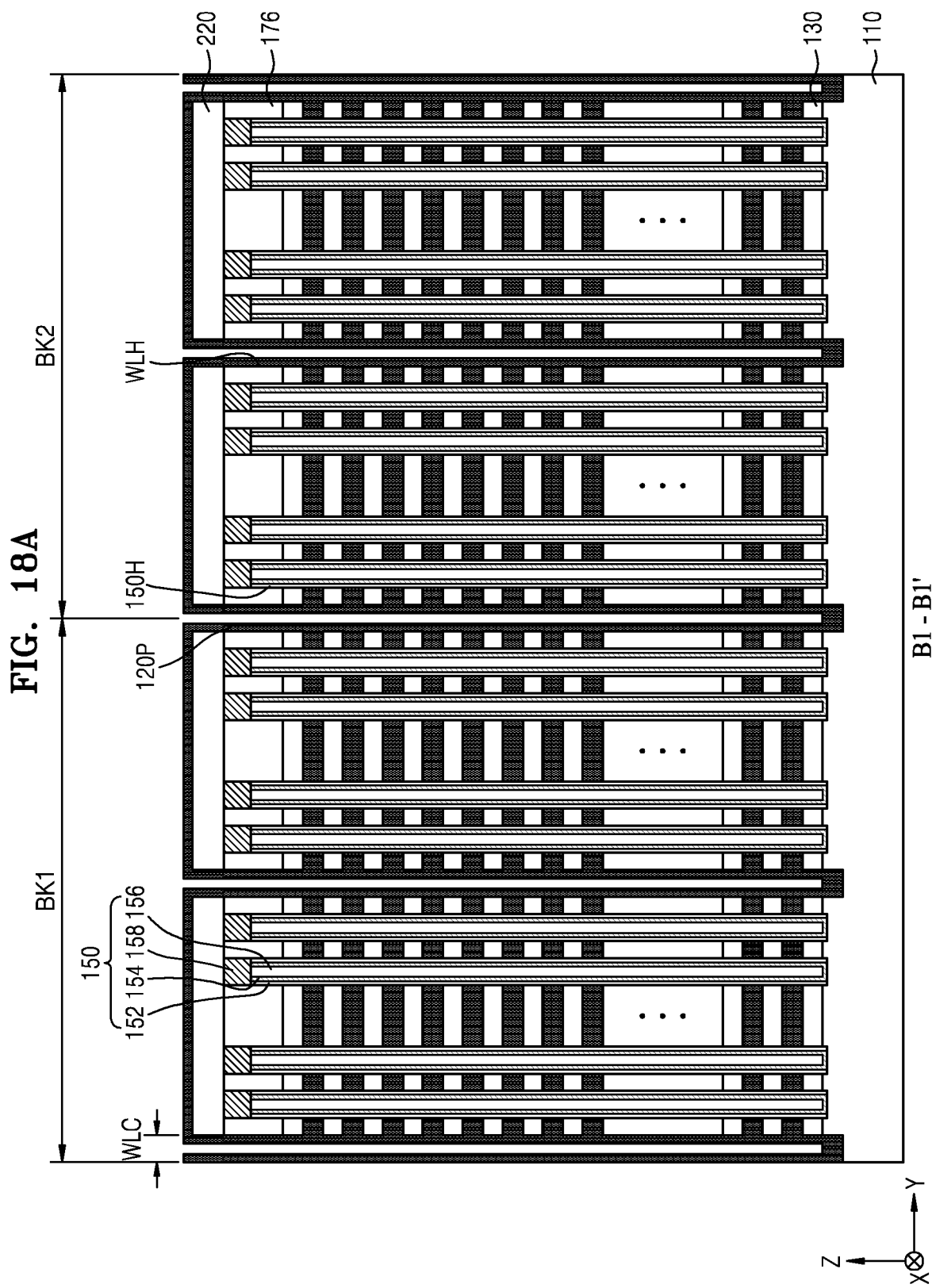
Figure 18B:
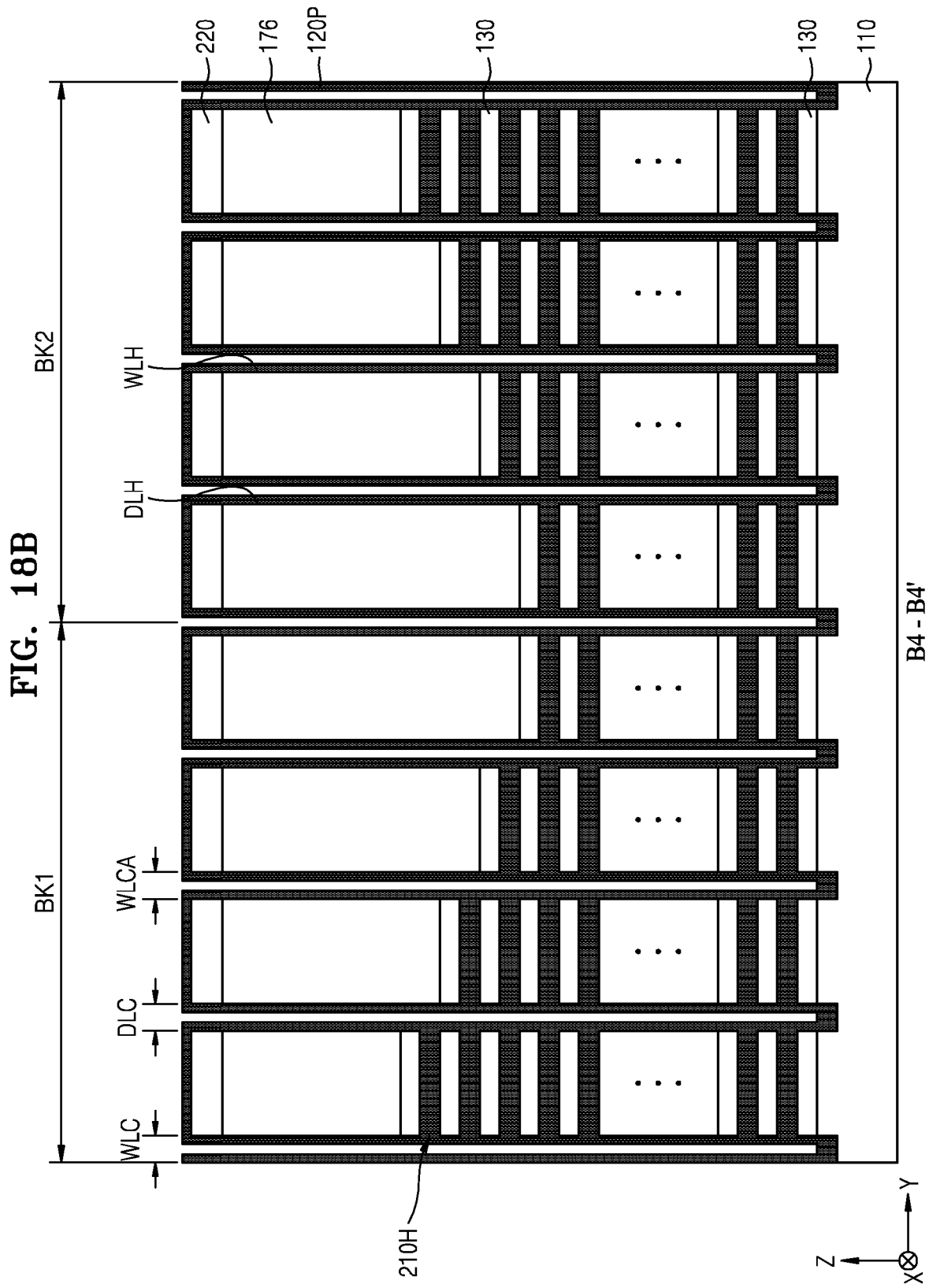

Referring to FIGS. 18A and 18B, by filling the word line opening WLH, the dummy line opening DLH, and the mold opening 210H with a metal material, a conductive layer 120P may be formed on the upper insulation layer 220 and in an empty space of the mold stack 210S.

In exemplary embodiments, an inflow path of a metal material included in the conductive layer 120P may be shortened by the dummy line opening DLH provided in the connection region CON in a process of forming the conductive layer 120P.

Figure 19B:
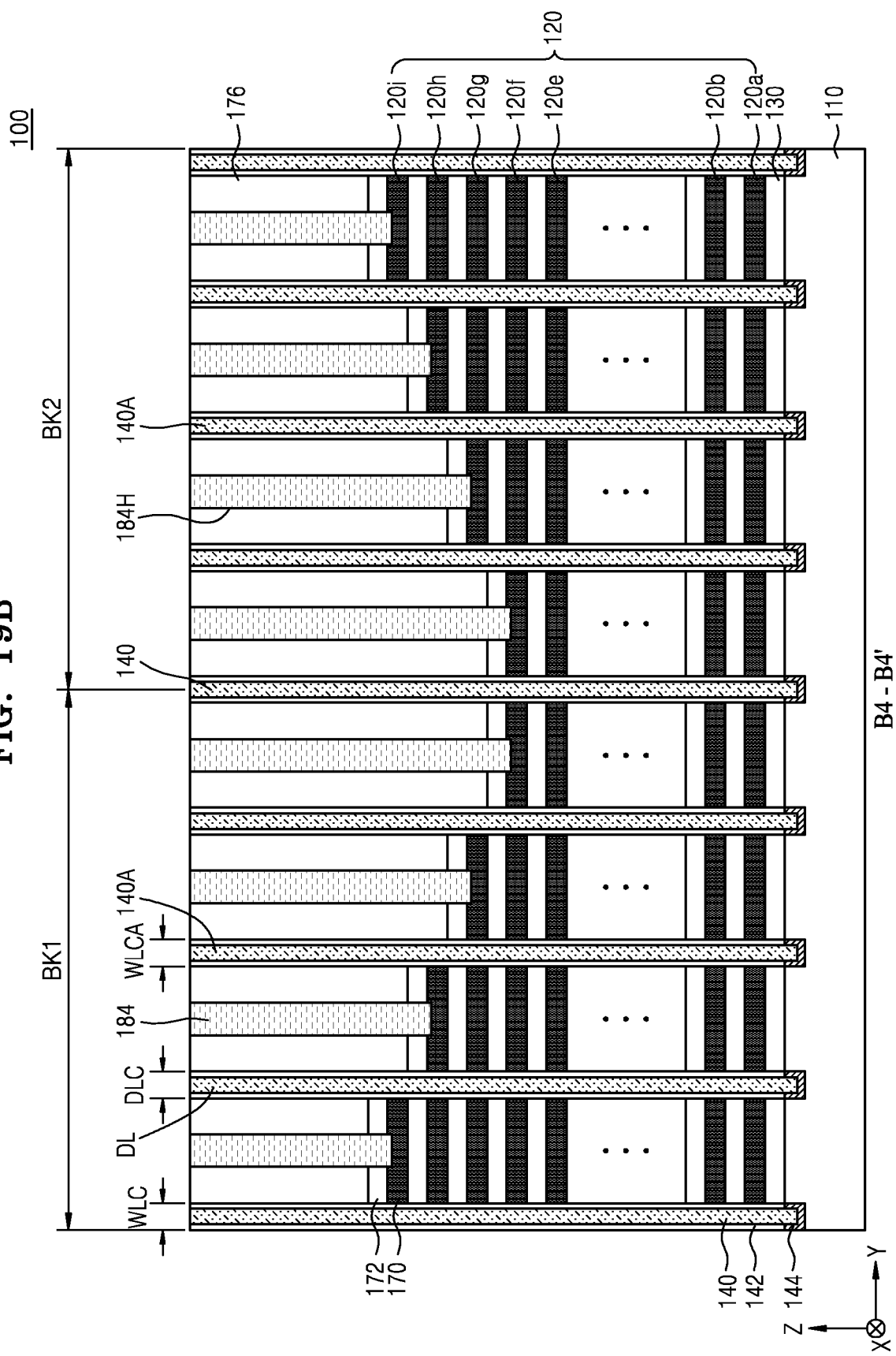

Referring to FIGS. 19A and 19B, by removing the conductive layer 120P provided in each of the word line opening WLH and the dummy line opening DLH, a plurality of gate electrodes 120 may remain in the mold opening 210H, and an upper surface of the substrate 110 may be exposed again. In the connection region CON, a portion of the conductive layer 120P remaining at a position from which the pad forming part 210P is removed may be referred to as a pad layer 170.

By implanting impurities into the substrate 110 through the word line opening WLH and the dummy line opening DLH, a common source region 144 may be formed in a portion of the substrate 110 under the word line cut region WLC and the dummy line cut region DLC.

Subsequently, an insulation spacer 142 and a dummy line insulation layer 162 may be respectively formed on sidewalls of the word line opening WLH and the dummy line opening DLH, and a common source line 140 and a dummy line DL respectively filling the word line opening WLH and the dummy line opening DLH may be formed on the insulation spacer 142 and the dummy line insulation layer 162.

Subsequently, the upper insulation layer 220 may be removed.

Subsequently, in the memory cell region MEC, a string separation region SLC may be formed by removing a portion of each of two uppermost gate electrodes 120k and 120l, and a string separation insulation layer 160 filling an internal portion of the string separation region SLC may be formed.

In a dummy cell region DM (see FIG. 5), a cell contact hole exposing an upper surface of a gate electrode 120 may be formed by removing a portion of the interlayer insulation layer 176, and a cell contact 183 (see FIG. 5) may be formed in the cell contact hole by filling a conductive material into the cell contact hole.

In the connection region CON, a pad contact hole 184H exposing an upper surface of the pad layer 170 may be formed by removing a portion of the interlayer insulation layer 176, and a pad contact 184 may be formed in the pad contact hole 184H by filling a conductive material into the pad contact hole 184H.

An insulation layer covering an upper surface of each of the channel structure 150 and the dummy channel structure D150 may be further formed on the interlayer insulation layer 176, and a bit line contact electrically connected to the channel structure 150 and the dummy channel structure D150 through the insulation layer may be further formed. In exemplary embodiments, unlike the illustrations of FIGS. 19A and 19B, the upper insulation layer 220 is not removed, and a bit line contact electrically connected to the channel structure 150 and the dummy channel structure D150 through the upper insulation layer 220 may be further formed.

According to the above-described method of manufacturing the semiconductor device 100, a supply path of an etchant for removing the sacrificial layer 210 and/or a supply path of a metal material included in the pad layer 170 may be relatively shortened by a plurality of dummy line cut regions DLC. Therefore, the metal material may be filled into the pad layer 170 without a void, and as a result, formation of a defect, which may occur in a process of forming the pad contact 184 connected to the pad layer 170, may be avoided.

Moreover, a pad connection region DLX may be disposed between a plurality of dummy line cut regions DLC, and portions of the gate electrodes 120 overlapping the pad connection region DLX may be connected to each other without being separated therefrom. As a result, the gate electrode 120 provided in a connection region CON may be prevented from being bent or from leaning by stress caused by a high temperature applied thereto in a manufacturing process.

While the inventive concept has been particularly shown and described with reference to the exemplary embodiments thereof, it will be understood that various changes in form and detail may be made therein without departing from the spirit and scope of the inventive concept as defined by the following claims.

What is claimed is:

1. A semiconductor device, comprising:
a substrate comprising a memory cell region and a connection region;
a plurality of gate electrodes disposed on the substrate in the memory cell region;
a plurality of channel structures passing through the plurality of gate electrodes;
a plurality of pad layers disposed on the substrate in the connection region, the plurality of pad layers extending in a first direction parallel to an upper surface of the substrate from each of the plurality of gate electrodes;
a first word line cut region and a second word line cut region passing through the plurality of gate electrodes and the plurality of pad layers, the first and second word line cut regions extending over an entire length of the plurality of gate electrodes and the plurality of pad layers in the first direction and being spaced apart from each other in a second direction parallel to the upper surface of the substrate and crossing the first direction;
at least two first dummy line openings between the first word line cut region and the second word line cut region and extending in the first direction across the memory cell region and the connection region; and
a plurality of second dummy line openings passing through the plurality of pad layers, the plurality of second dummy line openings being disposed between the first word line cut region and the at least two first dummy line openings and spaced apart from each other in the first direction,
wherein a number of the plurality of second dummy line openings is greater than a number of the at least two first dummy line openings.

2. The semiconductor device of claim 1, wherein
the first word line cut region has a first length in the first direction,
each of the at least two first dummy line openings has a second length smaller than the first length in the first direction, and
each of the plurality of second dummy line openings has a third length smaller than the second length in the first direction.

3. The semiconductor device of claim 1, wherein the plurality of pad layers comprises:
a first pad layer surrounding at least a portion of a sidewall of one of the plurality of second dummy line openings; and
a second pad layer surrounding at least a portion of a sidewall of another one of plurality of second dummy line openings adjacent to the one of the plurality of second dummy line openings, the second pad layer being disposed adjacent to the first pad layer in the first direction.

4. The semiconductor device of claim 3, wherein an upper surface of the second pad layer is at a level which is lower in position than an upper surface of the first pad layer.

5. The semiconductor device of claim 3, further comprising:
a plurality of pad contacts respectively disposed on the plurality of pad layers,
wherein each of the plurality of pad contacts is disposed in a central region of a corresponding pad layer in a plan view.

6. The semiconductor device of claim 3, wherein a length of the one of the plurality of second dummy line openings overlapping the first pad layer in the first direction is greater than about ½ of a width of the first pad layer in the first direction.

7. The semiconductor device of claim 1, wherein
a pad connection region is defined between two adjacent ones of the plurality of second dummy line openings, and
the pad connection region vertically overlaps two first pad layers adjacent to each other in the first direction and two second pad layers adjacent to the two first pad layers in the second direction.

8. The semiconductor device of claim 7, wherein the two first pad layers and the two second pad layers have an H-shape in a plan view.

9. The semiconductor device of claim 1, wherein the first word line cut region, the second word line cut region, the at least two first dummy line openings, and the plurality of second dummy line opening are filled with at least one of an insulation material or a metal material.

10. The semiconductor device of claim 1, wherein
the plurality of pad layers is disposed in a stepped form in the first direction, and
the plurality of pad layers is disposed in a stepped form in the second direction.

11. The semiconductor device of claim 1, further comprising:
at least two first dummy line insulation layers disposed on an inner wall of the at least two first dummy line openings; and
a plurality of second dummy line insulation layers disposed on an inner wall of the plurality of second dummy line openings.

12. The semiconductor device of claim 11, further comprising:
at least two first dummy lines disposed on the inner wall of the at least two first dummy line openings; and
a plurality of second dummy lines disposed on the inner wall of the plurality of second dummy line openings.

13. A semiconductor device, comprising:
a substrate comprising a memory cell region and a connection region;
a plurality of gate electrodes disposed on the substrate in the memory cell region;
a plurality of channel structures passing through the plurality of gate electrodes;
a plurality of pad layers disposed on the substrate in the connection region, the plurality of pad layers extending in a first direction parallel to an upper surface of the substrate from each of the plurality of gate electrodes;
a first word line cut region and a second word line cut region passing through the plurality of gate electrodes and the plurality of pad layers, the first and second word line cut regions extending over an entire length of the plurality of gate electrodes and the plurality of pad layers in the first direction and being spaced apart from each other in a second direction parallel to the upper surface of the substrate and crossing the first direction;
at least two first dummy line openings between the first word line cut region and the second word line cut region and extending in the first direction across the memory cell region and the connection region; and
a plurality of second dummy line openings passing through the plurality of pad layers, the plurality of second dummy line openings being disposed between the first word line cut region and the at least two first dummy line openings and spaced apart from each other in the first direction, wherein a length of each of the plurality of second dummy line openings in the first direction is smaller than a length of each of the at least two first dummy line openings in the first direction.

14. The semiconductor device of claim 13, a number of the plurality of second dummy line openings is greater than a number of the at least two first dummy line openings.

15. The semiconductor device of claim 13, wherein the plurality of pad layers comprises:
 a first pad layer surrounding at least a portion of a sidewall of one of the plurality of second dummy line openings; and
 a second pad layer surrounding at least a portion of a sidewall of another one of the plurality of second dummy line openings adjacent to the one of the plurality of second dummy line openings, the second pad layer being disposed adjacent to the first pad layer in the first direction.

16. The semiconductor device of claim 15, wherein an upper surface of the second pad layer is at a level which is lower in position than an upper surface of the first pad layer.

17. The semiconductor device of claim 13, wherein the first word line cut region, the second word line cut region, the at least two first dummy line openings, and the plurality of second dummy line opening are filled with at least one of an insulation material or a metal material.

18. The semiconductor device of claim 13, wherein
 a pad connection region is defined between two adjacent ones of the plurality of second dummy line openings, and
 the pad connection region vertically overlaps two first pad layers adjacent to each other in the first direction and two second pad layers adjacent to the two first pad layers in the second direction.

19. The semiconductor device of claim 18, wherein the two first pad layers and the two second pad layers have an H-shape in a plan view.

20. The semiconductor device of claim 13, further comprising:
 at least two first dummy line insulation layers disposed on an inner wall of the at least two first dummy line openings; and
 a plurality of second dummy line insulation layers disposed on an inner wall of the plurality of second dummy line openings.

\* \* \* \* \*